US008488109B2

(12) United States Patent
Shibazaki

(10) Patent No.: US 8,488,109 B2
(45) Date of Patent: Jul. 16, 2013

(54) EXPOSURE METHOD, EXPOSURE APPARATUS, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 384 days.

(21) Appl. No.: 12/860,299

(22) Filed: Aug. 20, 2010

(65) Prior Publication Data
US 2011/0051108 A1 Mar. 3, 2011

Related U.S. Application Data

(60) Provisional application No. 61/236,668, filed on Aug. 25, 2009.

(51) Int. Cl.
G01B 11/00 (2006.01)
G01B 11/14 (2006.01)
G03B 27/32 (2006.01)
G03B 27/42 (2006.01)
H02K 41/02 (2006.01)

(52) U.S. Cl.
USPC ........... 355/77; 310/12.06; 356/399; 356/614

(58) Field of Classification Search
USPC ................. 310/12.05–12.06; 355/53, 72, 75, 355/77; 356/399–401, 614–624
See application file for complete search history.

(56) References Cited

U.S. PATENT DOCUMENTS

| 4,465,368 A | 8/1984 | Matsuura et al. |
| 5,117,255 A | 5/1992 | Shiraishi et al. |
| 5,448,332 A | 9/1995 | Sakakibara et al. |
| 5,610,715 A | 3/1997 | Yoshii et al. |
| 5,969,441 A | 10/1999 | Loopstra et al. |
| 6,008,610 A | 12/1999 | Yuan et al. |
| 6,208,407 B1 | 3/2001 | Loopstra |
| 6,590,634 B1 | 7/2003 | Nishi et al. |
| 6,611,316 B2 | 8/2003 | Sewell |
| 6,778,257 B2 | 8/2004 | Bleeker et al. |

(Continued)

FOREIGN PATENT DOCUMENTS

| EP | 1 420 298 A2 | 5/2004 |
| JP | A-04-127514 | 4/1992 |

(Continued)

OTHER PUBLICATIONS

International Search Report issued in International Patent Application No. PCT/JP2010/064660 dated Oct. 28, 2010.

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

Positional information of a stage is obtained using an interferometer system only during an exposure time when a constant speed drive of the stage is performed to form a pattern. Therefore, the linear measurement of the positional information is secured enough, which makes it possible to linearly drive the stage with high accuracy. Meanwhile, between an acceleration time and a deceleration time in which a step drive is performed, the positional information of the stage is obtained using an encoder system and a surface position measurement system. Therefore, measurement reproducibility of the positional information is sufficiently secured by the mechanical stability of a diffraction grating, which makes it possible to drive the stage precisely to the starting position of the constant speed drive.

42 Claims, 14 Drawing Sheets

U.S. PATENT DOCUMENTS

| | | | |
|---|---|---|---|
| 6,819,425 B2 | 11/2004 | Kwan | |
| 7,023,610 B2 | 4/2006 | Ohtsuki et al. | |
| 7,025,498 B2 | 4/2006 | del Puerto | |
| 7,102,729 B2 | 9/2006 | Renkens et al. | |
| 7,161,659 B2 | 1/2007 | Van Den Brink et al. | |
| 7,253,875 B1 | 8/2007 | Luttikhuis et al. | |
| 7,256,871 B2 | 8/2007 | Loopstra et al. | |
| 7,289,212 B2 | 10/2007 | Kwan | |
| 7,292,312 B2 | 11/2007 | Loopstra et al. | |
| 7,333,174 B2 | 2/2008 | Koenen et al. | |
| 7,348,574 B2 | 3/2008 | Pril et al. | |
| 7,349,069 B2 | 3/2008 | Beems et al. | |
| 7,362,446 B2 | 4/2008 | Van Der Pasch et al. | |
| 7,405,811 B2 | 7/2008 | Beems et al. | |
| 7,446,851 B2 | 11/2008 | Hirukawa | |
| 7,483,120 B2 | 1/2009 | Luttikhuis et al. | |
| 7,561,280 B2 | 7/2009 | Schluchter et al. | |
| 7,602,489 B2 | 10/2009 | Van Der Pasch et al. | |
| 7,619,207 B2 | 11/2009 | Loopstra et al. | |
| 7,636,165 B2 | 12/2009 | Klaver et al. | |
| 7,710,540 B2 | 5/2010 | Loopstra et al. | |
| 2002/0041377 A1 | 4/2002 | Hagiwara et al. | |
| 2002/0061469 A1 | 5/2002 | Tanaka | |
| 2003/0025890 A1 | 2/2003 | Nishinaga | |
| 2003/0128348 A1* | 7/2003 | Nishi | 355/53 |
| 2005/0088133 A1 | 4/2005 | Ebihara et al. | |
| 2005/0128461 A1 | 6/2005 | Beems et al. | |
| 2006/0139660 A1 | 6/2006 | Kwan | |
| 2006/0227309 A1 | 10/2006 | Loopstra et al. | |
| 2007/0052976 A1 | 3/2007 | Pril et al. | |
| 2007/0076218 A1 | 4/2007 | Van Empel et al. | |
| 2007/0263191 A1 | 11/2007 | Shibazaki | |
| 2007/0288121 A1 | 12/2007 | Shibazaki | |
| 2008/0043212 A1 | 2/2008 | Shibazaki | |
| 2008/0074681 A1 | 3/2008 | Loopstra et al. | |
| 2008/0088843 A1 | 4/2008 | Shibazaki | |
| 2008/0094592 A1 | 4/2008 | Shibazaki | |
| 2008/0094593 A1 | 4/2008 | Shibazaki | |
| 2008/0094594 A1 | 4/2008 | Shibazaki | |
| 2008/0094604 A1 | 4/2008 | Shibazaki | |
| 2008/0106722 A1 | 5/2008 | Shibazaki | |
| 2008/0212056 A1 | 9/2008 | Shiraishi | |
| 2008/0218713 A1 | 9/2008 | Shibazaki | |
| 2008/0240501 A1 | 10/2008 | Van Der Wijst et al. | |
| 2009/0004580 A1 | 1/2009 | Kanaya | |
| 2009/0027640 A1 | 1/2009 | Shibazaki et al. | |
| 2009/0033900 A1 | 2/2009 | Kanaya | |
| 2009/0040488 A1 | 2/2009 | Shibazaki | |
| 2009/0051892 A1 | 2/2009 | Shibazaki et al. | |
| 2009/0051893 A1 | 2/2009 | Shibazaki et al. | |
| 2009/0051894 A1 | 2/2009 | Shibazaki et al. | |
| 2009/0051895 A1 | 2/2009 | Shibazaki | |
| 2009/0053629 A1 | 2/2009 | Shibazaki et al. | |
| 2009/0059194 A1 | 3/2009 | Kanaya | |
| 2009/0059198 A1 | 3/2009 | Shibazaki et al. | |
| 2009/0073405 A1 | 3/2009 | Kanaya | |
| 2009/0115982 A1 | 5/2009 | Kanaya | |
| 2009/0122285 A1 | 5/2009 | Kanaya | |
| 2009/0122286 A1 | 5/2009 | Kanaya | |
| 2009/0122287 A1 | 5/2009 | Kanaya | |
| 2009/0153822 A1 | 6/2009 | Shibazaki | |
| 2009/0161086 A1 | 6/2009 | Shibazaki | |
| 2009/0190104 A1 | 7/2009 | Shibazaki | |
| 2009/0190110 A1 | 7/2009 | Shibazaki | |
| 2009/0201513 A1 | 8/2009 | Shibazaki | |
| 2009/0225288 A1 | 9/2009 | Shibazaki | |
| 2009/0262321 A1 | 10/2009 | Makinouchi | |
| 2009/0273767 A1* | 11/2009 | Makinouchi | 355/53 |
| 2009/0284716 A1 | 11/2009 | Kanaya | |
| 2009/0284717 A1 | 11/2009 | Kanaya | |
| 2009/0284723 A1 | 11/2009 | Shibazaki | |
| 2009/0284724 A1 | 11/2009 | Kanaya | |

FOREIGN PATENT DOCUMENTS

| | | |
|---|---|---|
| JP | A-04-265805 | 9/1992 |
| JP | A-11-016816 | 1/1999 |
| JP | A-2005-166951 | 6/2005 |
| JP | A-2009-033062 | 2/2009 |
| WO | WO 99/49504 A1 | 9/1999 |
| WO | WO 03/065428 A1 | 8/2003 |
| WO | WO 2006/038952 A2 | 4/2006 |
| WO | WO 2009075103 A1 * | 6/2009 |

OTHER PUBLICATIONS

Written Opinion issued in International Patent Application No. PCT/JP2010/064660 dated Oct. 28, 2010.

U.S. Appl. No. 12/816,775, filed Jun. 16, 2010, in the name of Yuichi Shibazaki.

* cited by examiner

EXPOSURE METHOD, EXPOSURE APPARATUS, AND DEVICE MANUFACTURING METHOD

CROSS-REFERENCE TO ABLATED APPLICATIONS

This non-provisional application claims the benefit of Provisional Application No. 61/236,668 filed Aug. 25, 2009, the disclosure of which is hereby incorporated herein by reference in its entirety.

BACKGROUND OF THE INVENTION

1. Field of the Invention

The present invention relates to exposure methods, exposure apparatuses, and device manufacturing methods, and more particularly, to an exposure method and an exposure apparatus used in a lithography process when semiconductor devices, liquid crystal display devices and the like are produced, and a device manufacturing method using the exposure method.

2. Description of the Background Art

Conventionally, in a lithography process for manufacturing microdevices (such as electron devices) such as semiconductor devices, liquid crystal display devices and the like, exposure apparatuses such as a reduction projection exposure apparatus by a step-and-repeat method (a so-called stepper) and a projection exposure apparatus by a step-and-scan method (a so-called scanning stepper (which is also called a scanner) are mainly used.

In this kind of exposure apparatus, in order to transfer a pattern of a reticle (or a mask) on a plurality of shot areas on a wafer, a wafer stage holding the wafer is driven, for example, by linear motors and the like. In this case, position measurement of the wafer stage is generally performed, using a laser interferometer which is stable and has high resolution.

However, requirements for a stage position control with higher precision are increasing due to finer patterns that accompany higher integration of semiconductor devices, and now, measurement errors resulting from air fluctuation generated by temperature variation of the atmosphere on the beam path of the laser interferometer or by temperature gradient has come to occupy a large percentage in the overlay budget.

As a position measurement device of the stages in place of the laser interferometer, an encoder (for example, refer to U.S. Patent Application Publication No. 2008/0088843) is promising. However, while the encoder is superior in the viewpoint of measurement reproducibility because of using a scale, it is inferior for the mechanical instability (drift of the grating pitch, fixed location drift, thermal expansion and the like) of the scale in the viewpoint of linearity. Further, as a surface position measurement device of the stage, while a surface position measurement sensor (refer to, for example, U.S. Patent Application Publication No. 2008/0086843) which measures the surface position of the scale is promising, it is similarly inferior in the viewpoint of linearity.

In view of the drawbacks of the laser interferometer and the encoder (and the surface position measurement sensor) described above, various proposals are being made (refer to, for example, Kokai (Japanese patent Unexamined Application Publication) No. 2009-033062) of methods used to measure the position of a stage using both a laser interferometer and an encoder (a position detection sensor which uses a diffraction grating). However, the methods and the like disclosed in Kokai (Japanese Patent Unexamined Application Publication) No. 2009-033062 are still not sufficient enough when carrying out a highly accurate and stable position control of the stage which is required in the current exposure apparatus.

SUMMARY OF THE INVENTION

According to a first aspect of the present invention, there is provided a first exposure method in which a pattern is sequentially formed on a plurality of shot areas arranged on an object, the method comprising: measuring a positional information of a movable body which moves along a predetermined plane holding the object by a first measurement system which irradiates a first measurement beam on a first measurement plane and receives a reflected beam, and performing a constant speed drive of the movable body in a scanning direction to form the pattern in each of the plurality of shot areas using the measurement results; and measuring a positional information of the movable body by a second measurement system which irradiates a second measurement beam on a second measurement plane different from the first measurement plane, and receives a reflected beam, and performing a stepping drive of the movable body toward a starting position of the constant speed drive to form the pattern in each of the plurality of shot areas using the measurement results.

According to this method, when performing a constant speed drive of the movable body to form a pattern on each of the plurality of shot areas, a first measurement system is used, and when a step movement of the movable body is performed, a second measurement system is used. Therefore, as each of the first and second measurement systems, a measurement system which is suitable for the constant speed drive of the movable body and the drive to the starting position of the constant speed drive can be used, which allows a precise alignment to be performed on each of the plurality of shot areas arranged on the object and the pattern to be formed with good precision.

According to a second aspect of the present invention, there is provided a first exposure apparatus which sequentially forms a pattern on a plurality of shot areas arranged on an object, the apparatus comprising: a movable body which holds the object and moves along a predetermined plane; a first measurement system which measures positional information of the movable body by irradiating a first measurement beam on a first measurement plane and receiving a reflected beam; a second measurement system which measures positional information of the movable body by irradiating a second measurement beam on a second measurement plane different from the first measurement plane and receiving a reflected beam; and a control system which performs a constant drive of the object in a scanning direction to form the pattern in each of the plurality of shot areas using measurement results of the first measurement system, and performs a step drive of the movable body toward a starting position of the constant drive to form the pattern in each of the plurality of shot areas using measurement results of the second measurement system.

According to this apparatus, when the control system performs a constant speed drive of the movable body to form a pattern on each of the plurality of shot areas, a first measurement system is used, and when the control system performs a step movement of the movable body, a second measurement system is used. Therefore, as each of the first and second measurement systems, a measurement system which is suitable for the constant speed drive of the movable body and the drive to the starting position of the constant speed drive can be used, which allows a precise alignment to be performed on each of the plurality of shot areas arranged on the object and the pattern to be formed with good precision.

According to a third aspect of the present invention, there is provided a second exposure apparatus which sequentially forms a pattern on a plurality of shot areas arranged on an object, the apparatus comprising: a movable body which holds the object and moves along a predetermined plane; a first measurement system which measures positional information of the movable body by irradiating a first measurement beam on a first measurement plane and receiving a reflected beam; a second measurement system which measures positional information of the movable body by irradiating a second measurement beam on a second measurement plane different from the first measurement plane and receiving a reflected beam; and a control system which drives the movable body using measurement results of the first measurement system at least during scanning exposure, and in at least a part of a period besides during the scanning exposure, uses measurement results of the second measurement system, during a series of operations to sequentially form the pattern on the plurality of shot areas on the object.

According to the apparatus, the control system drives the movable body using measurement results of the first measurement system at least during scanning exposure, and in at least a part of a period besides during the scanning exposure, uses measurement results of the second measurement system, during a series of operations to sequentially form the pattern on the plurality of shot areas on the object. Therefore, as each of the first and second measurement systems, a measurement system which is suitable for the drive of the movable body during scanning exposure and the drive of the movable body at a period besides the scanning exposure can be used, which allows a precise alignment to be performed on each of the plurality of shot areas arranged on the object and the pattern to be formed with good precision.

According to a fourth aspect of the present invention, there is provided a second exposure method in which a pattern is sequentially formed on a plurality of shot areas arranged on an object held by a movable body that moves along a predetermined plane, the method comprising: driving the movable body using measurement results of a first measurement system, which irradiates a first measurement beam on a first measurement plane and receives the reflected beam, at least during scanning exposure in a series of operations to sequentially form a pattern on the plurality of shot areas on the object, and driving the movable body using measurement results of a second measurement system, which irradiates a second measurement beam on a second measurement plane and receives the reflected beam, at least in a part of a period besides the scanning exposure.

According to a fifth aspect of the present invention, there is provided a device manufacturing method, including forming a pattern on an object using one of the first and second exposure apparatus of the present invention, and developing the object on which the pattern is formed.

According to a sixth aspect of the present invention, there is provided a device manufacturing method, including forming a pattern on an object using one of the first and second exposure methods of the present invention, and developing the object on which the pattern is formed.

BRIEF DESCRIPTION OF THE DRAWINGS

In the accompanying drawings.

DESCRIPTION OF THE EMBODIMENTS

Figure 1:
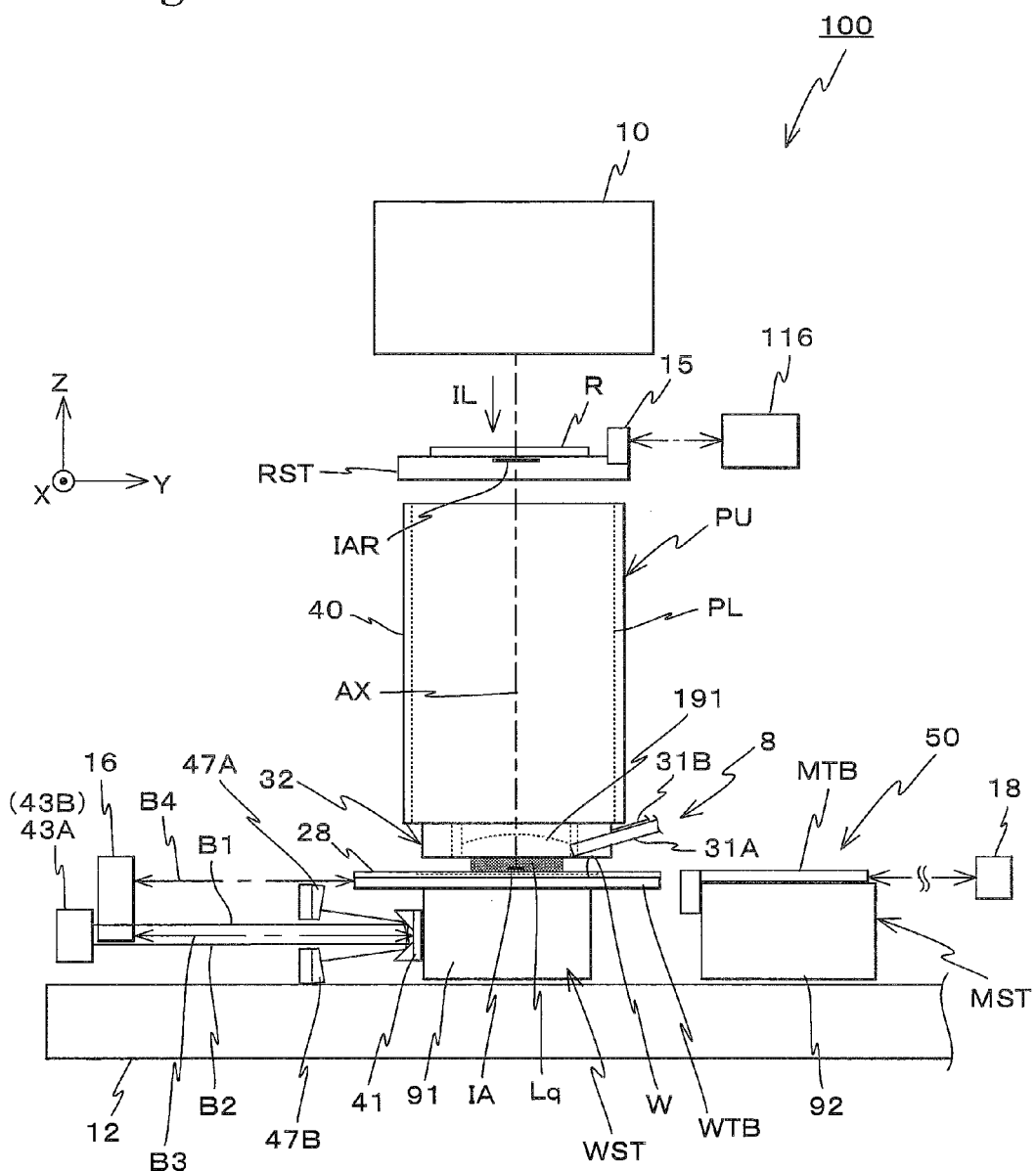
FIG. 1 is a view that schematically shows a configuration of an exposure apparatus of an embodiment.

An embodiment of the present invention will be described below, with reference to FIGS. 1 to 14. FIG. 1 shows a schematic configuration of an exposure apparatus 100 in the embodiment.

Exposure apparatus 100 is a projection exposure apparatus by the step-and-scan method, or a so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

As shown in FIG. 1, exposure apparatus 100 is equipped with an illumination system 10, a reticle stage RST, a projection unit PU, a local liquid immersion device 8, a stage device 50 which has a wafer stage WST and a measurement stage MST, and a control system of these sections and the like. In FIG. 1, a wafer W is mounted on wafer stage WST.

Illumination system 10 includes a light source, an illuminance uniformity optical system, which includes an optical integrator and the like, an illumination optical system that has a reticle blind and the like (none of which are shown), as is disclosed in, for example, it Patent Application Publication No. 2003/0025890 description and the like. Illumination system 10 illuminates a slit-shaped illumination area IAR which is set (limited) on reticle R with a reticle blind (a masking system) by illumination light (exposure light) IL with a substantially uniform illuminance. In this case, as illumination light IL, for example, an ArF excimer laser beam (wavelength 193 nm) is used. Further, as the optical integrator, for example, a fly-eye lens, a rod integrator (an internal reflection type integrator), a diffractive optical element or the like can be used.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive section 11 (not shown in FIG. 1, refer to FIG. 7) that includes a linear motor or the like, and reticle stage RST is also drivable in a scanning direction (in this case, the Y-axis direction, which is the lateral direction of the page surface in FIG. 1) at a predetermined scanning speed.

The positional information (including rotation information in the θz direction) of reticle stage RST in the XY plane is constantly detected, for example, at a resolution of around 0.25 nm by a reticle laser interferometer (hereinafter referred to as a "reticle interferometer") 116, via a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction). The measurement values of reticle interferometer 116 are sent to a main controller 20 (not shown in FIG. 1, refer to FIG. 7). Main controller 20 computes the position of reticle stage RST in the X-axis direction, Y-axis direction, and the θz direction based on the measurement values of reticle interferometer 116, and also controls the position (and velocity) of reticle stage RST by controlling reticle stage drive section 11 based on the computation results. Incidentally, instead of movable mirror 15, the edge surface of reticle stage RSV can be mirror polished so as to form a reflection surface (corresponding to the reflection surface of movable mirror 15). Further, reticle interferometer 116 can measure positional information of reticle stage RST related to at least one of the Z-axis, θx, or θy directions. Further, instead of using the reticle interferometer, measurement of positional information of reticle stage RST can be performed using an encoder system.

Projection unit PU is placed below reticle stage RST in FIG. 1. Projection unit PU includes a barrel 40, and projection optical system PL that has a plurality of optical elements which are held in a predetermined positional relation inside barrel 40. As projection optical system PL, for example, a dioptric system is used, consisting of a plurality of lenses (lens elements) that is disposed along optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area IAR, illumination light IL that has passed through reticle R which is placed so that its pattern surface substantially coincides with a first plane (an object plane) of projection optical system FL forms a reduced image of the circuit pattern (a reduced image of a part of the circuit pattern) of reticle R formed within illumination area IAR, via projection optical system PL (projection unit PU), in an area (hereinafter, also referred to as an exposure area) IA conjugate to illumination area IAR on wafer W whose surface is coated with a resist (a sensitive agent) and is placed on a second plane (an image plane) side of projection optical system PL. And by reticle stage RST and wafer stage WST being synchronously driven, reticle R is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern of reticle R is generated on wafer W according to illumination system 10 and projection optical system PL, and then by the exposure of the sensitive layer (resist layer) on wafer W with illumination light IL, the pattern is formed on wafer W.

Although it is not shown in the drawings, projection unit PU is mounted on a barrel platform supported by three struts via a vibration isolation mechanism, however, as is disclosed in, for example, PCT International Publication No. 2006/038952 and the like, projection unit PU can be supported by suspension with respect to a mainframe member (not shown) placed above projection unit PU or with respect to a base member on which reticle stage RST is placed. Further, in wafer W, in addition to a sensitive layer, for example, a protection film (a topcoat film) which protects the wafer or the sensitive layer can also be formed.

Figure 4:
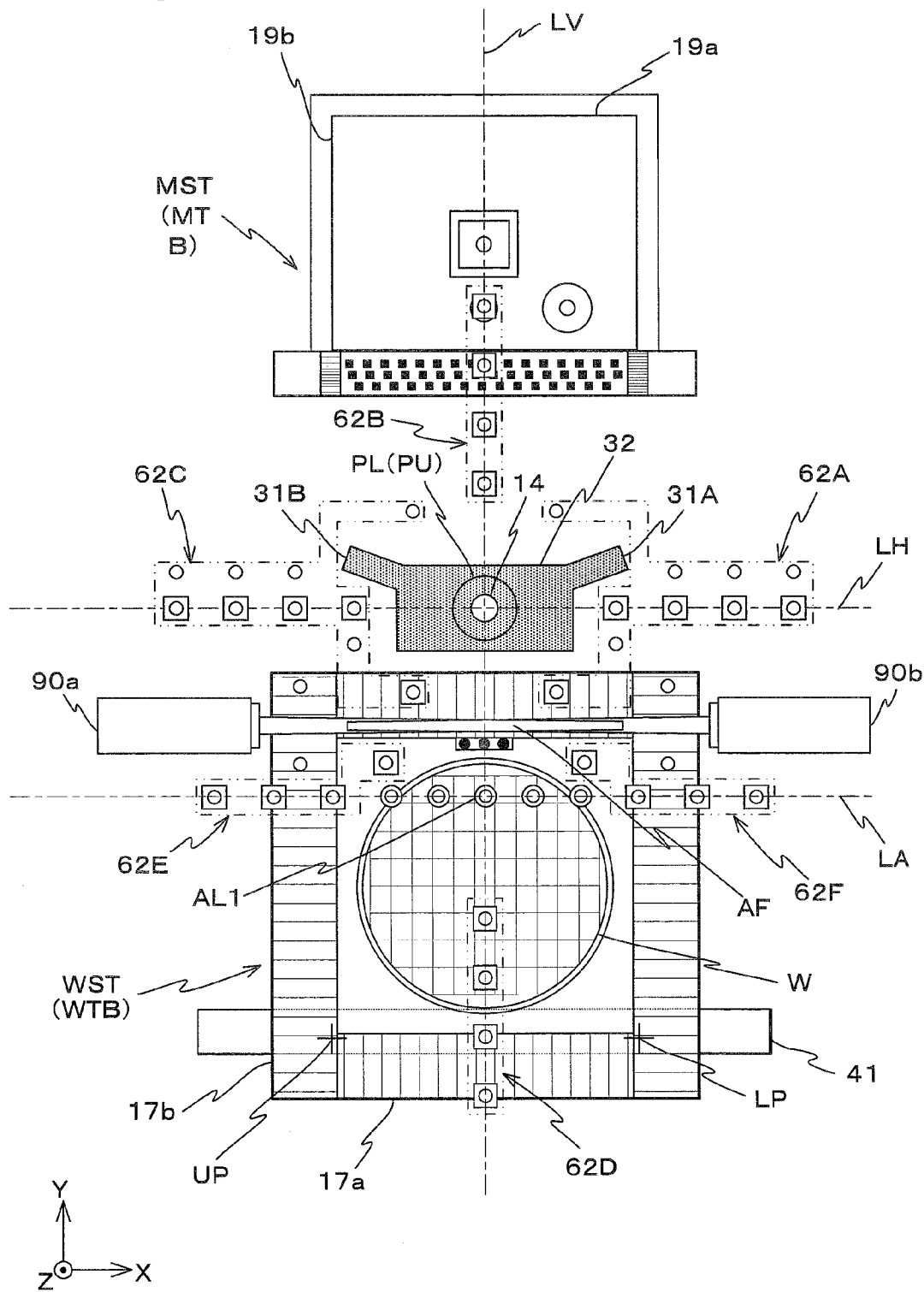
FIG. 4 is a planar view showing a placement of measurement devices equipped in the exposure apparatus in FIG. 1.

In exposure apparatus 100 of the embodiment, because exposure applying the liquid immersion method is performed, a nozzle unit 32 that constitutes part of a local liquid immersion device 8 is arranged so as to enclose the periphery of the lower end portion of barrel 40 that holds an optical element that is closest to an image plane side (wafer W side) that constitutes projection optical system PL, which is a lens (hereinafter, also referred to a "tip lens") 191 in this case. In the embodiment, as shown in FIG. 1, the lower end surface of nozzle unit 32 is set to be on a substantially flush surface with the lower end surface of tip lens 191. Further, nozzle unit 32 is equipped with a supply opening and a recovery opening of a liquid Lq, a lower surface to which wafer W is placed facing and at which the recovery opening is arranged, and a supply flow channel and a recovery flow channel that are connected to a liquid supply pipe 31A and a liquid recovery pipe 31B respectively. As shown in FIG. 4, liquid supply pipe 31A and liquid recovery pipe 31B are inclined at an angle of 45 degrees with respect to the X-axis direction and the Y-axis direction in a planer view (when viewed from above) and are symmetrically placed with respect to a straight line LV parallel to the Y-axis that passes through optical axis AX of projection optical system PL. In FIG. 4, a reference code UP indicates an unloading position where the center of wafer stage WST is positioned at the time of unloading the wafer on wafer stage WST, and a reference code LP indicates a loading position where the center of wafer stage WST is positioned at the time of loading a wafer on wafer stage WST. In the embodiment, unloading position UP and loading position LP are set symmetrically with respect to reference axis LV. Incidentally, unloading position UP and loading position LP may be the same position.

Figure 7:
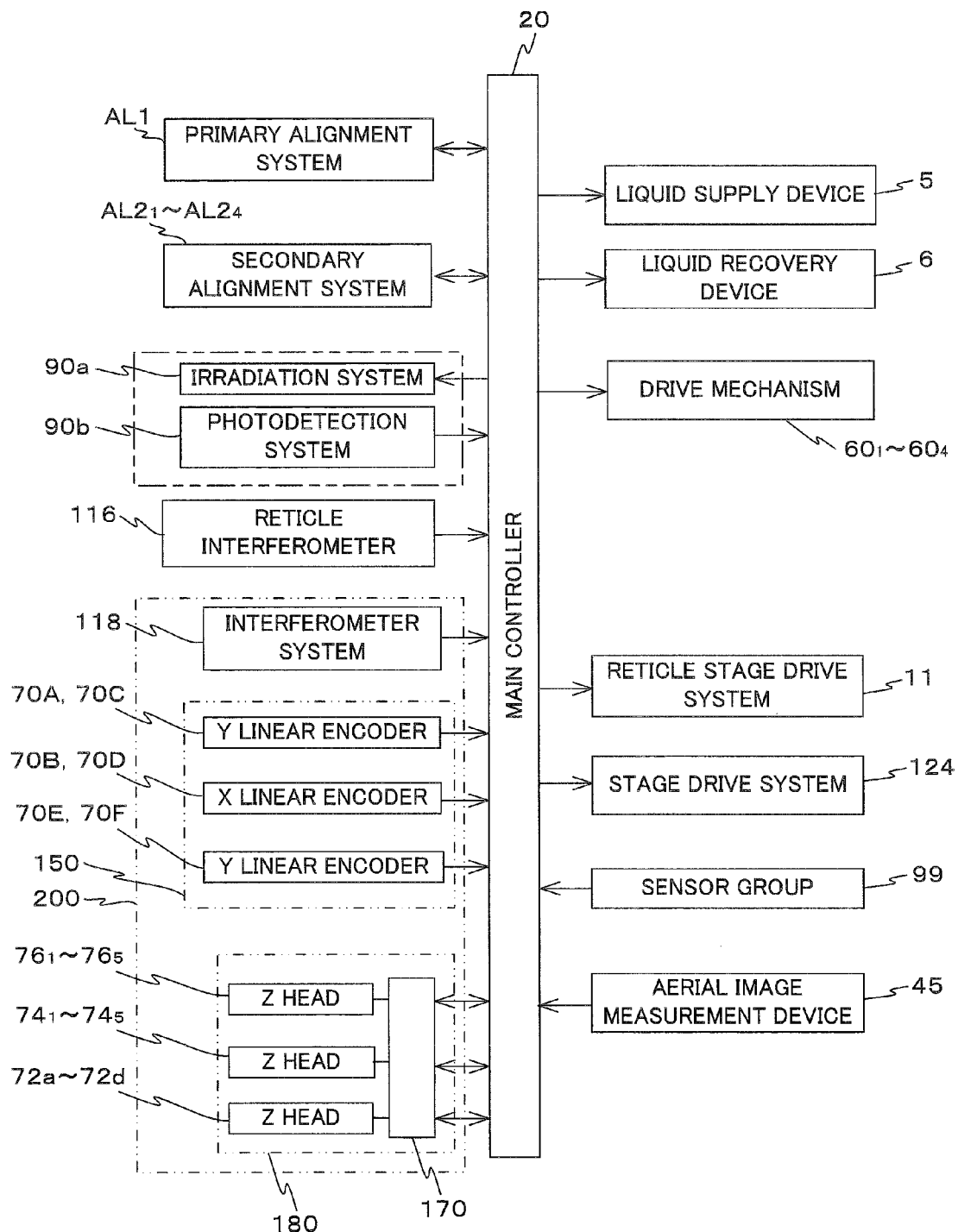
FIG. 7 is a block diagram that shows an input/output relation of a main controller, which centrally configures a control system of the exposure apparatus in FIG. 1.

One end of a supply pipe (not shown) is connected to liquid supply pipe 31A while the other end of the supply pipe is connected to a liquid supply unit 5 (not shown in FIG. 1, refer to FIG. 7), and one end of a recovery pipe (not shown) is connected to liquid recovery pipe 31B while the other end of the recovery pipe is connected to a liquid recovery device 6 (not shown in FIG. 1, refer to FIG. 7).

Liquid supply unit 5 includes a liquid tank, a compression pump, a temperature controller, a valve for controlling supply/stop of the liquid to liquid supply pipe 31A, and the like. As the valve, for example, a flow rate control valve is preferably used so that not only the supply/stop of the liquid but also the adjustment of flow rate can be performed. The temperature controller adjusts the temperature of the liquid within the liquid tank, for example, to nearly the same temperature as the temperature within the chamber (not shown) where the exposure, apparatus is housed. Incidentally, the tank for supplying the liquid, the compression pump, the temperature controller, the valve, and the like do not all have to be equipped in exposure apparatus 100, and at least part of them can also be substituted by the equipment or the like available in the plant where exposure apparatus 100 is installed.

Liquid recovery unit 6 includes a liquid tank, a suction pump, a valve for controlling recovery/stop of the liquid via liquid recovery pipe 31B, and the like. As the valve, it is desirable to use a flow control valve similar to the valve of liquid supply device 5. Incidentally, the tank for recovering the liquid, the suction pump, the valve, and the like do not all have to be equipped in exposure apparatus 100, and at least part of them can also be substituted by the equipment or the like available in the plant where exposure apparatus 100 is installed.

In the embodiment, as the liquid described above, pure water (hereinafter, it will simply be referred to as "water" besides the case when specifying is necessary) that transmits the ArF excimer laser light (light with a wavelength of 193 nm) is to be used. Pure water can be obtained in large quantities at a semiconductor manufacturing plant or the like without difficulty, and it also has an advantage of having no adverse effect on the photoresist on the wafer, to the optical lenses or the like.

Refractive index n of the water with respect to the ArF excimer laser light is around 1.44. In the water the wavelength of illumination light IL is 193 nm×1/n, shorted to around 134 nm.

Liquid supply device 5 and liquid recovery device 6 each have a controller, and the respective controllers are controlled by main controller 20 (refer to FIG. 7). According to instructions from main controller 20, the controller of liquid supply device 5 opens the valve connected to liquid supply pipe 31A to a predetermined degree to supply water to the space between tip lens 191 and wafer W via liquid supply pipe 31A, the supply flow channel and the supply opening. Further, when the water is supplied, according to instructions from main controller 20, the controller of liquid recovery unit 6 opens the valve connected to liquid recovery pipe 31B to a predetermined degree to recover the water from the space between tip lens 191 and wafer W into liquid recovery unit 6 (the liquid tank) via the recovery opening, the recovery flow channel and liquid recovery pipe 31B. During the supply and recovery operations, main controller 20 gives commands to the controllers of liquid supply device 5 and liquid recovery device 6 so that the quantity of liquid supplied to the space between tip lens 191 and wafer W constantly equals the quantity of liquid recovered from the space. Accordingly, a constant quantity of liquid (water) Lq (refer to FIG. 1) is held in the space between tip lens 191 and wafer W. In this case, liquid (water) Lq held in the space between tip lens 191 and wafer W is constantly replaced. This forms a liquid immersion area 14 (refer to FIG. 4).

As is obvious from the above description, in the embodiment, local liquid immersion device 8 is configured including nozzle unit 32, liquid supply device 5, liquid recovery device 6, liquid supply pipe 31A and liquid recovery pipe 31B, and the like. Incidentally, part of local liquid immersion device 8, for example, at least nozzle unit 32 may also be supported in a suspended state by a main frame (including the barrel platform) that holds projection unit PU, or may also be arranged at another frame member that is separate from the main frame. Or, in the case projection unit PU is supported in a suspended state as is described earlier, nozzle unit 32 may also be supported in a suspended state integrally with projection unit PU, however, in the embodiment, nozzle unit 32 is arranged on a measurement frame that is supported in a suspended state independently from projection unit PU. In this case, projection unit PU does not have to be supported in a suspended state.

Incidentally, in the case measurement stage MST which will be described later on is positioned below projection unit PU, liquid immersion area 14 can be formed similarly as is described above in the space between tip lens 191 and a measurement table described later on.

Incidentally, in the description above, one liquid supply pipe (nozzle) and one liquid recovery pipe (nozzle) were arranged as an example, however, the present invention is not limited to this, and a configuration having multiple nozzles as is disclosed in, for example, PCT International Publication No. 99/49504, may also be employed, in the case such an arrangement is possible taking into consideration a relation with adjacent members. The point is that any configuration can be employed, as long as the liquid can be supplied in the space between optical member (tip lens) 191 in the lowest end constituting projection optical system PL and wafer W. The liquid immersion mechanism disclosed in, for example, U.S. Pat. No. 7,446,851, or the liquid immersion mechanism disclosed in the EP Patent Publication No. 1420298 can also be applied to the exposure apparatus in the embodiment.

As shown in FIG. 1, stage device 50 is equipped with a wafer stage WST and a measurement stage MST placed on a base board 12, a measurement system 200 (refer to FIG. 7) which obtains (measures) positional information of both stages WST and MST, a stage drive system 124 (refer to FIG. 7) which drives both stages WST and MST and the like. Measurement system 200 includes an interferometer system 118, an encoder system 150, and a surface position measurement system 180 as shown in FIG. 7.

On the bottom surface of each of wafer stage WST and measurement stage MST, noncontact bearings (not shown) such as for example, air bearings are provided at a plurality of places, and wafer stage WST and measurement stage MST are supported above base board 12, via a predetermined clearance, such as for example, a clearance of around several μm. Further, both stages WST and MST are independently drivable, for example, by stage drive system 124 (refer to FIG. 7) which includes a linear motor and the like. Incidentally, a planar motor can be employed as stage drive system 124, and in this case, both stages WST and MST can each be supported by levitation by a magnetic force.

Wafer stage WST1, as shown in FIG. 1, includes a stage main section 91, and a wafer table WTB mounted on stage main section 91. Wafer table WTB and stage main section 91 are configured drivable in directions of six degrees of freedom (X, Y, Z, θx, θy, and θz) with respect to base board 12 by a drive system including a linear motor and a Z leveling mechanism (including a voice coil motor and the like). Incidentally, wafer stage WST is not limited to a single stage which can be driven in directions of six degrees of freedom, and can include a stage main body 91 that can move freely in the XY plane, and a wafer table WTB which is mounted on stage main body 91 and can be finely driven relatively in the Z-axis direction, the θx direction, and the θy direction with respect to stage main body 91.

Figure 2A:
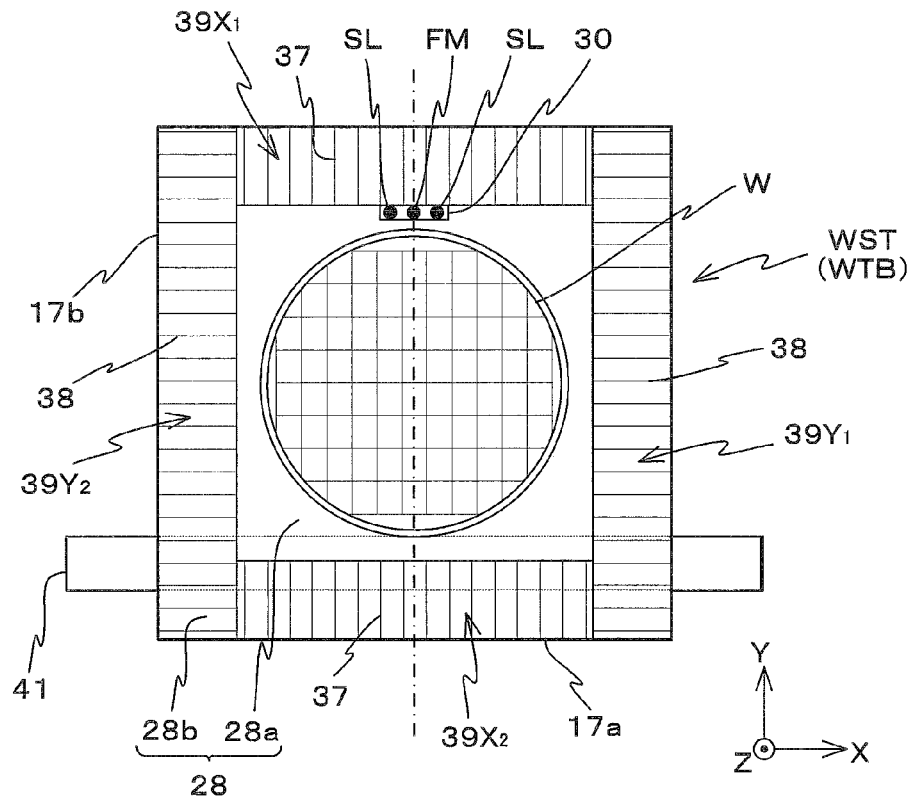
FIG. 2A is a planar view showing a wafer stage.

In the center of the upper surface of wafer table WTB, a wafer holder (not shown) is arranged which holds wafer W by vacuum suction or the like. The wafer holder may also be formed integrally with wafer table WTB, but in the embodiment, the wafer holder and wafer table WTB are separately configured, and the wafer holder is fixed inside a recessed portion of wafer table WTB, for example, by vacuum suction or the like. Further, on the upper surface of wafer table WTB, as is shown in FIG. 2A, a plate (liquid repellent plate) 28 is arranged, which has the surface (liquid repellent surface) substantially flush with the surface of the wafer mounted on the wafer holder to which liquid repellent processing with respect to liquid Lq is performed, has a rectangular outer shape (contour), and has a circular opening that is formed in the center portion and is slightly larger than the wafer holder (a mounting area of the wafer). Plate 28 is made of materials with a low coefficient of thermal expansion, such as glasses or ceramics (such as Zerodur (the brand name) of Schott AG, $Al_2O_3$, or TiC), and on the surface of plate 28, a liquid repellent film is formed by, for example, fluorine resin materials, fluorine series resin materials such as polytetrafluoroethylene (Teflon (registered trademark)), acrylic resin materials, or silicon series resin materials. Furthermore, plate 28 has a first liquid repellent area 28a whose outer shape (contour) is rectangular enclosing the circular opening described above, and a second liquid repellent area 28b that has a rectangular frame (annular) shape placed around the first liquid repellent area 28a. On first liquid repellent area 28a, for example, at the time of an exposure operation, at least part of a liquid immersion area 14 that is protruded from the surface of the wafer is formed, and on second liquid repellent area 28b, scales for an encoder system (to be described later) are formed. Incidentally, at least part of the surface of plate 28 does not have to be flush with the surface of the wafer, that is, may have a different height from that of the surface of the wafer. Further, plate 28 may be a single plate, but in the embodiment, plate 28 is configured by combining a plurality of plates, for example, first and second liquid repellent plates that correspond to the first liquid repellent area 28a and the second liquid repellent area 28b respectively. In the embodiment, pure water is used as liquid Lq as is described above, and therefore, hereinafter the first liquid repellent area 28a and the second liquid repellent area 28b are also referred to as a first water repellent plate 28a and a second water repellent plate 28b.

In this case, exposure light IL is irradiated to the first water repellent plate 28a on the inner side, while exposure light IL is hardly irradiated to the second water repellent plate 26b on the outer side. Taking this fact into consideration, in the embodiment, a first water repellent area to which water repellent coat having sufficient resistance to exposure light IL (light in a vacuum ultraviolet region, in this case) is applied is formed on the surface of the first water repellent plate 28a, and a second water repellent area to which water repellent coat having resistance to exposure light IL inferior to the first water repellent area is applied is formed on the surface of the second water repellent plate 28b. In general, since it is difficult to apply water repellent coat having sufficient resistance to exposure light IL (light in a vacuum ultraviolet region, in this case) to a glass plate, it is effective to separate the water repellent plate into two sections in this manner, i.e. the first water repellent plate 28a and the second water repellent plate 28b around it. Incidentally, the present invention is not limited to this, and two types of water repellent coat that have different resistance to exposure light IL may also be applied on the upper surface of the same plate in order to form the first water repellent area and the second water repellent area. Further, the same kind of water repellent coat may be applied to the first and second water repellent areas. For example, only one water repellent area may also be formed on the same plate.

Further, as is obvious from FIG. 2A, at the end portion on the +Y side of the first water repellent plate 28a, a rectangular cutout is formed in the center portion in the X-axis direction, and a measurement plate 30 is embedded inside the rectangular space (inside the cutout) that is enclosed by the cutout and the second water repellent plate 28b. A fiducial mark FM is formed in the center in the longitudinal direction of measurement plate 30, and a pair of aerial image measurement slit patterns (slit-shaped measurement patterns) SL are formed in the symmetrical placement with respect to the center of the fiducial mark on one side and the other side in the X-axis direction of fiducial mark FM. As each of aerial image measurement slit patterns SL, an L-shaped slit pattern having sides along the Y-axis direction and X-axis direction, or two linear slit patterns extending in the X-axis and Y-axis directions respectively can be used, as an example. And, in correspondence with each aerial image measurement slit pattern SL, a light-transmitting system (not shown) which guides illumination light IL passing through the slit patterns outside wafer stage WST photodetection system arranged in measurement stage MST which will be described later on) is arranged.

Moreover, on the upper surface of the second water repellent plate 28b, multiple grid lines are directly formed in a predetermined pitch along each of four sides. More specifically, in areas on one side and the other side in the X-axis direction of the second water repellent plate 28b (both sides in the horizontal direction in FIG. 2A), Y scales $39Y_1$ and $39Y_2$ are formed, respectively. Y scales $39Y_1$ and $39Y_2$ are each composed of a reflective grating (for example, a diffraction grating) having a periodic direction in the Y-axis direction in which grid lines 38 having the longitudinal direction in the X-axis direction are arranged in a predetermined pitch along a direction parallel to the Y-axis (the Y-axis direction).

Similarly, in areas on one side and the other side in the Y-axis direction of the second water repellent plate 28b (both sides in the vertical direction in FIG. 2A), X scales $39X_1$ and 39X2 are formed respectively. X scales $39X_1$ and 39X2 are each composed of a reflective grating (for example, a diffraction grating) having a periodic direction in the X-axis direction in which grid lines 37 having the longitudinal direction in the Y-axis direction are arranged in a predetermined pitch along a direction parallel to the X-axis (the X-axis direction). As each of the scales, a scale is used that has a reflective diffraction grating made by, for example, hologram or the like, on the surface of the second water repellent plate 28b. In this case, each scale has gratings made up of narrow slits, grooves or the like that are marked at a predetermined distance (pitch) as graduations. The type of diffraction grating used for each scale is not limited, and not only the diffraction grating made up of grooves or the like that are mechanically formed, but also, for example, the diffraction grating that is created by exposing interference fringe on a photosensitive resin may be used. However, each scale is created by marking the graduations of the diffraction grating, for example, in a pitch between 138 nm to 4 μm, for example, a pitch of 1 μm on a thin plate shaped glass. These scales are covered with the liquid repellent film (water repellent film) described above. Incidentally, the pitch of the grating is shown much wider in FIG. 2A and in other drawings than the actual pitch, for the sake of convenience.

Further, in order to protect the diffraction grating, it is also effective to cover the grating with a glass plate with low thermal expansion that has liquid repellency. In this case, as the glass plate (also referred to as a cover glass), a plate whose thickness is the same level as the wafer, such as for example, a plate 1 mm thick, can be used, and the plate is set on the upper surface of wafer table WTB so that the surface of the glass plate becomes the same height (a flush surface) as the wafer surface.

Further, to the −Y edge surface and the −X edge surface of wafer table WTB, mirror-polishing is applied, respectively, and a reflection surface 17a and a reflection surface 17b shown in FIG. 2A are formed.

Measurement stage MST includes a stage main section 92 driven in the XY plane by a linear motor and the like (not shown), and a measurement table MTB mounted on stage main section 92, as shown in FIG. 1. Measurement stage MST is also configured drivable in at least directions of three degrees of freedom (X, Y, and θz) with respect to base board 12 by a drive system (not shown).

Incidentally, in FIG. 7, the drive system of wafer stage WST and the drive system of measurement stage MST are included and are shown as stage drive system 124.

Figure 2B:
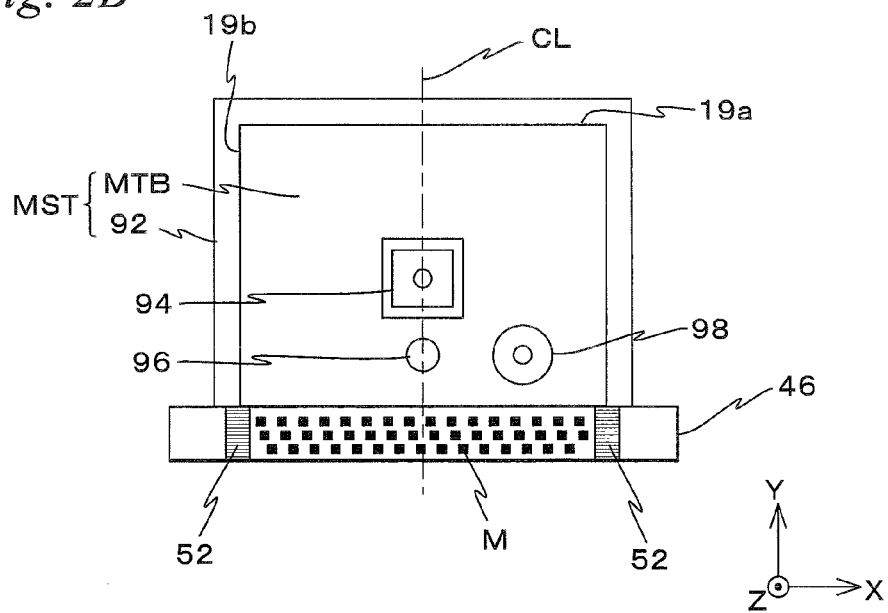
FIG. 2B is a planar view showing a measurement stage.

Various measurement members are arranged at measurement table MTB (and stage main section 92). As such measurement members, for example, as shown in FIG. 2B, members such as an uneven illuminance measuring sensor 94 that has a pinhole-shaped light-receiving section which receives illumination light IL on an image plane of projection optical system PL, an aerial image measuring instrument 96 that measures an aerial image (projected image) of a pattern projected by projection optical system PL, a wavefront aberration measuring instrument 98 by the Shack-Hartman method that is disclosed in, for example, PCT International Publication No. 03/065428 and the like are employed.

As irregular illuminance sensor 94, the configuration similar to the one that is disclosed in, for example, U.S. Pat. No. 4,465,368 description and the like, can be used. Further, as aerial image measuring instrument 96, the configuration similar to the one that is disclosed in, for example, U.S. Patent Application Publication No. 2002/0041377 description and the like can be used.

Incidentally, three measurement members (94, 96 and 98) are to be arranged at measurement stage MST in the embodiment, however, the types and/or the number of measurement members are/is not limited to them. As the measurement members, for example, measurement members such as a transmittance measuring instrument that measures a transmittance of projection optical system PL, and/or a measuring instrument that observes local liquid immersion unit 8, for example, nozzle unit 32 (or tip lens 191) or the like may also be used. Furthermore, members different from the measurement members such as a cleaning member that cleans nozzle unit 32, tip lens 191 or the like may also be mounted on measurement stage MST.

In addition to each of the sensors described above, an illuminance monitor that has a light-receiving section having a predetermined area size that receives illumination light IL on the image plane of projection optical system PL may also be employed, which is disclosed in, for example, Kokai (Japanese Unexamined Patent Application Publication) No. 11-016816 (the corresponding U.S. Patent Application Publication No. 2002/0061469) and the like.

Incidentally, in the embodiment, liquid immersion exposure is performed in which wafer W is exposed with exposure light (illumination light) IL via projection optical system PL and liquid (water) Lq, and accordingly irregular illuminance sensor 94 (and the illuminance monitor), aerial image measuring instrument 96 and wavefront aberration measuring instrument 98 that are used in measurement using illumination light IL receive illumination light IL via projection optical system PL and water. Further, only part of each sensor such as the optical system may be mounted on measurement table MTB (and stage main section 92), or the entire sensor may be placed on measurement table MTB (and stage main section 92).

In stage main section 92 of measurement stage MST, a pair of photodetection systems is fixed in a placement that can face the pair of light-transmitting systems previously described. In the embodiment, in a state where wafer stage WST and measurement stage MST are in proximity within a predetermined distance in the Y-axis direction (including a contact state), illumination lights IL that has been transmitted through each aerial image measurement slit pattern SL of measurement plate 30 on wafer stage WST are guided by each light-transmitting system and are received by photodetection elements of each photodetection system within measurement stage MST. That is, measurement plate 30, the light-transmitting system and the photodetection system constitute an aerial image measurement device 45 (refer to FIG. 7), which is similar to the one disclosed in, U.S. Patent Application Publication No. 2002/0041377 description referred to previously, and the like.

On a surface on the −Y side of measurement table MTB, a fiducial bar (hereinafter, shortly referred to as an "FD bar") 46, which is made up of a bar-shaped member having a rectangular sectional shape and serves as a reference member, is attached extending in the X-axis direction, as shown in FIG. 2B. FD bar 46 is kinematically supported on measurement stage MST by a full-kinematic mount structure.

Since FD bar 46 serves as a prototype standard (measurement standard), optical glass ceramics with a low coefficient of thermal expansion, such as Zerodur (the brand name) of Schott AG are employed as the materials. The flatness degree of the upper surface (the surface) of FD bar 46 is set high to be around the same level as a so-called datum plane plate. Further, a reference grating (for example, a diffraction grating) 52 whose periodic direction is the Y-axis direction is respectively formed in the vicinity of the end portions on one side and the other side in the longitudinal direction of FD bar 46. The pair of reference gratings 52 is formed placed apart from each other at a predetermined distance symmetric to the center in the X-axis direction of FD bar 46, or more specifically, formed in a symmetric placement to centerline CL.

Further, on the upper surface of FD bar 46, a plurality of reference marks M is formed. The plurality of reference marks M are formed in three-row arrays in the Y-axis direction in the same pitch, and the array of each row is formed being shifted from each other by a predetermined distance in the X-axis direction. As each of the reference marks M, a two-dimensional mark having a size that can be detected by a primary alignment system and secondary alignment systems (to be described later) is used Reference mark M may also be different in shape (constitution) from fiducial mark FM, but in the embodiment, reference mark M and fiducial mark FM have the same constitution and also, they have the same constitution with that of an alignment mark of wafer W.

Incidentally, in the embodiment, the surface of FD bar 46 and the surface of measurement table MTB (which may include the measurement members described above) are also covered with a liquid repellent film (water repellent film) severally.

Further, on the +Y end surface and the −X end surface of measurement table MTB, reflection surfaces 19a and 19b used by the interferometer are formed similar to wafer table WTB as previously described.

Figure 5:
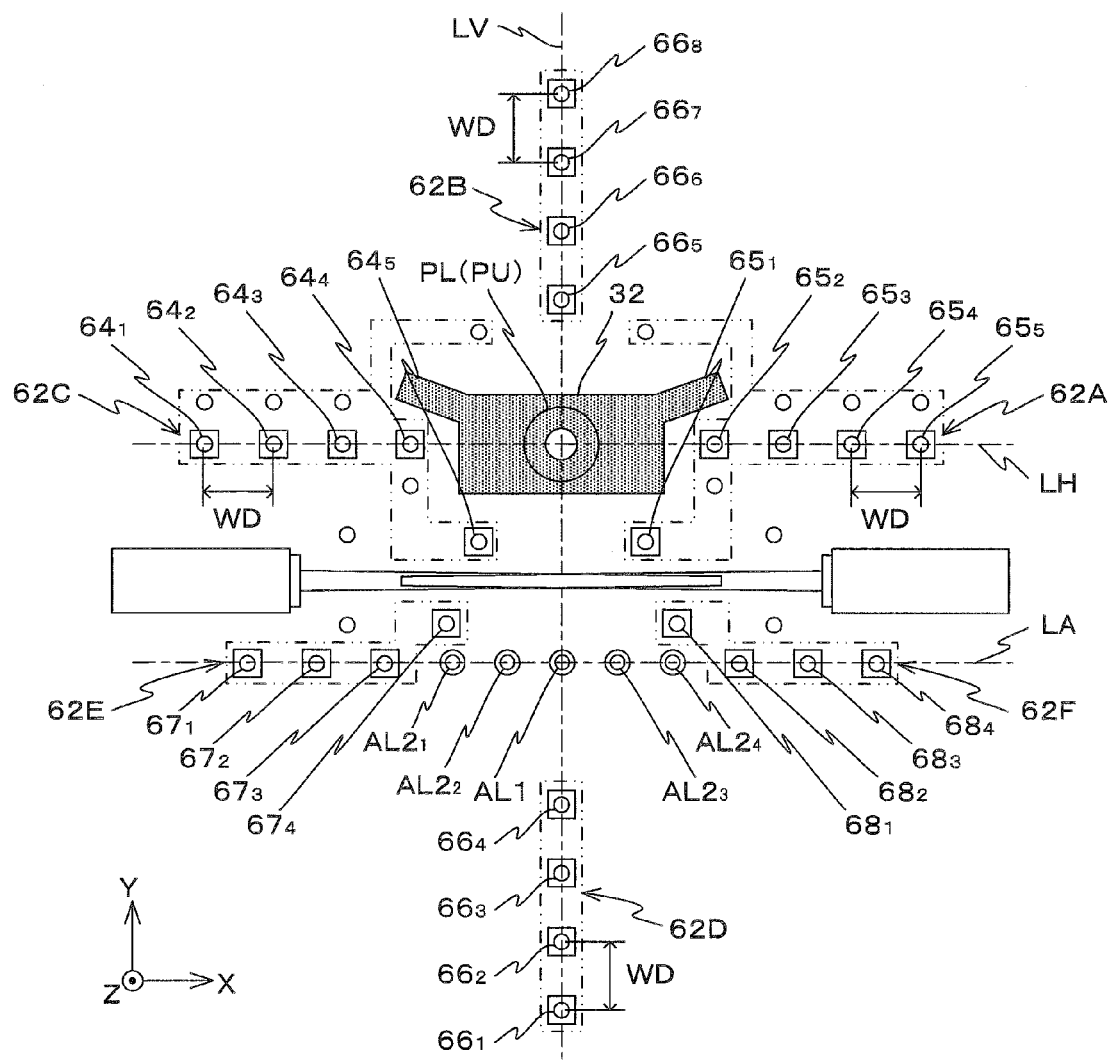
FIG. 5 is a planar view showing a placement of encoder heads (an X head and a Y head) and an alignment system.

In exposure apparatus 100 of the embodiment, although it is omitted in FIG. 1 from the viewpoint of avoiding intricacy of the drawing, a primary alignment system AL1 having a detection center at a position spaced apart from optical axis AX of projection optical system PL at a predetermined distance on the −Y side is provided on reference axis LV previously described, as shown in FIGS. 4 and 5. Primary alignment system AL1 is fixed to the lower surface of the mainframe (not shown). As shown in FIG. 5, on one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to reference axis LV are severally arranged. That is, five alignment systems AL1 and $AL2_1$ to $AL2_4$ are placed so that their detection centers are placed at different positions in the X-axis direction, that is, placed along the X-axis direction.

Secondary alignment systems $AL2_1$ to $AL2_4$ are fixed via a movable support member to the lower surface of the main frame (not shown), and by drive mechanisms $60_1$ to $60_4$ (refer to FIG. 7), the position of their detection areas is adjusted independently in the X-axis direction. In other words, the detection areas (or the detection centers) of secondary alignment systems $AL2_1$, $AL2_2$, $AL2_3$, and $AL2_4$ are independently movable in the X-axis direction. Accordingly, the relative positions of the detection areas of primary alignment system AL1 and secondary alignment systems $AL2_1$, $AL2_2$, $AL2_3$, and $AL2_4$ are adjustable in the X-axis direction.

In the embodiment, as each of alignment systems AL1 and $AL2_1$ to $AL2_4$, for example, an FIA (Field Image Alignment) system by an image processing method is used. The imaging signals from each of alignment systems AL1 and $AL2_1$ to $AL2_4$ are supplied to main controller 20, via a signal processing system (not shown).

Incidentally, each of the alignment systems described above is not limited to the FIA system, and an alignment sensor, which irradiates a coherent detection light to a subject mark and detects a scattered light or a diffracted light generated from the subject mark or makes two diffracted lights (e.g. diffracted lights of the same order or diffracted lights being diffracted in the same direction) generated from the subject mark interfere and detects an interference light, can naturally be used alone or in combination as needed. Further, five alignment systems AL1 and $AL2_1$ to $AL2_4$ are to be arranged in the embodiment. However, the number of alignment systems is not limited to five, but may be the number equal to or more than two and equal to or less than four, or may be the number equal to or more than six, or may be the even number, not the odd number. Moreover, in the embodiment, five alignment systems AL1 and $AL2_1$ to $AL2_4$ are to be fixed to the lower surface of the main frame that holds projection unit PU, via support member 54. However, the present invention is not limited to this, and for example, the five alignment systems may also be arranged on the measurement frame described earlier.

Figure 3:
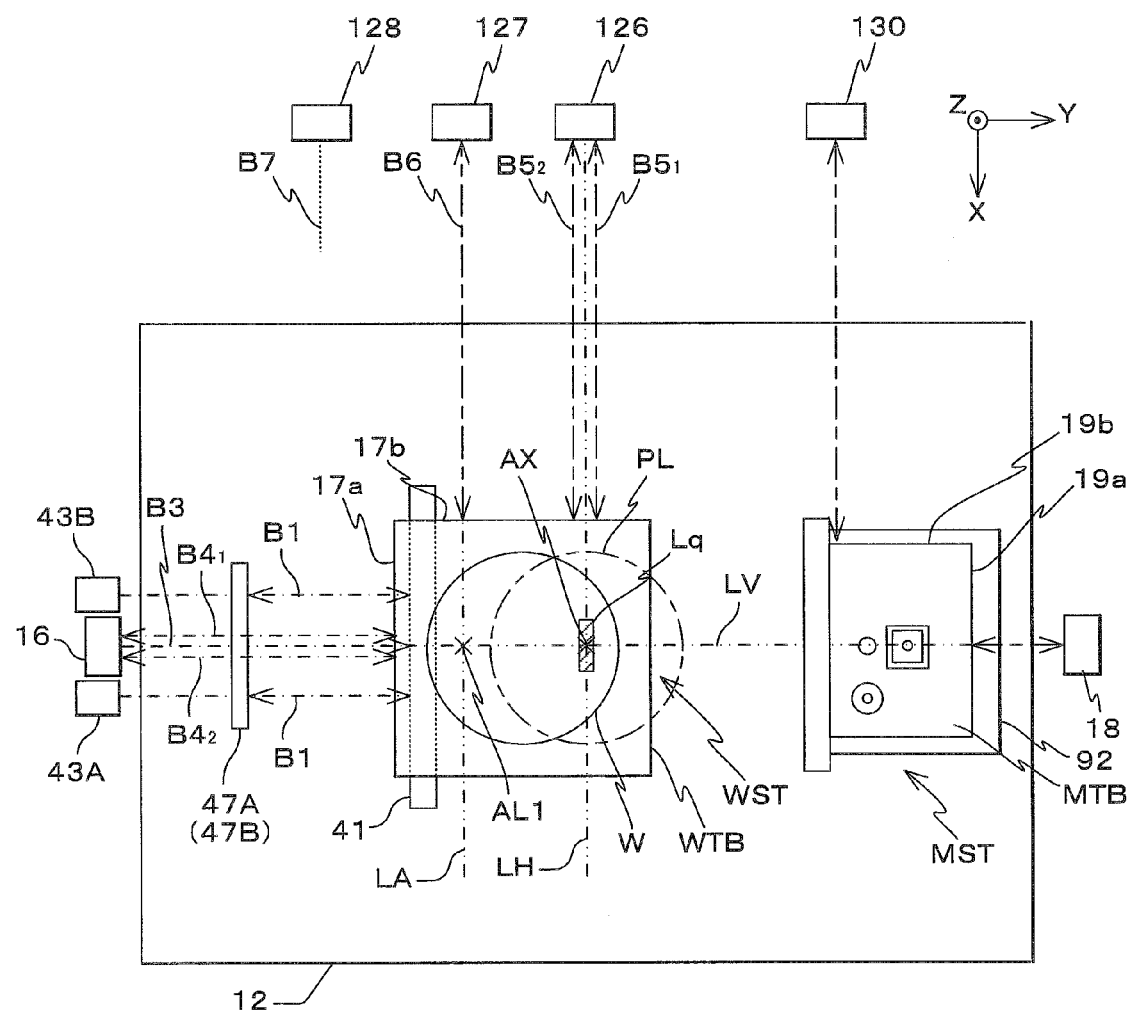
FIG. 3 is a planar view showing a placement of an interferometer equipped in the exposure apparatus in FIG. 1.

Interferometer system 118 is equipped with a Y interferometer 16 and three X interferometers 126, 127, and 128 which are used to measure a displacement from a reference position of each reflection surfaces by irradiating an interferometer beam (a measurement beam) on reflection surfaces 17a and 17b, respectively, and receiving their reflected lights, or more specifically, used to measure the position of wafer stage WST, as shown in FIG. 3. Interferometer system 118 is also equipped with a Y interferometer 18, an X interferometer 130 and the like used to measure the position of measurement stage MST by irradiating an interferometer beam (a measurement beam) on reflection surfaces 19a and 19b, respectively, and receiving their reflected lights, as shown in FIG. 3.

To enter the details, Y interferometer 16 irradiates at least three measurement beams parallel to the Y-axis including a pair of measurement beams $B4_1$ and $B4_2$ which is symmetric with respect to reference axis LV on reflection surface 17a and a movable mirror 41 (to be described later on). Further, X interferometer 126 irradiates at least three measurement beams parallel to the X-axis including a pair of measurement beams $B5_1$ and $B5_2$ which is symmetric with respect to a straight line (hereinafter referred to as a reference axis) LH orthogonal to optical axis AX and reference axis LV and parallel to the X-axis on reflection surface 17b, as shown in FIG. 3. Further, X interferometer 127 irradiates at least two measurement beams parallel to the Y-axis including a measurement beam B6 whose measurement axis is a straight line (hereinafter referred to as a reference axis) LA which is orthogonal to reference axis LV at the detection center of alignment system AL1 and is parallel to the X-axis, on reflection surface 17b. Further, X interferometer 128 irradiates a measurement beam B7 which is parallel to the Y-axis on reflection surface 17b.

The positional information of each of the interferometers of interferometer system 118 is supplied to main controller 20. Therefore, in addition to the X, Y positions of wafer table WTB (wafer stage WST), main controller 20 can also obtain rotation information (that is, pitching information) in the θx direction, rotation information (that is, rolling information) in the θy direction, and rotation information (that is, yawing information) in the θz direction, based on the measurement results of Y interferometer 16 and X interferometers 126 or 127.

Further, as shown in FIG. 1, movable mirror 41 having a concave-shaped reflection surface is attached to the side surface on the −Y side of stage main section 91. As it can be seen from FIG. 2A, movable mirror 41 is designed so that the length in the X-axis direction is longer than reflection surface 17a of wafer table WT5.

A pair of Z interferometers 43A and 43B (refer to FIGS. 1 and 3) that configures a part of interferometer system 118 (refer to FIG. 7) is arranged facing movable mirror 41. Z interferometers 43A and 43B irradiate two measurement beams B1 and B2, respectively, on fixed mirrors 47A and 47B, which are fixed, for example, on a frame (not shown) supporting projection unit PU, via movable mirror 41. And, Z interferometers 43A and 43B receive each of the reflected lights, and measure the optical path length of measurement beams B1 and 52. And from the results, main controller 20 computes the position of wafer stage WST in four degrees of freedom (Y, Z, θy, and θz) directions.

Y interferometer 18 and X interferometer 130 of interferometer system 118 irradiate interferometer beams (measurement beams) on reflection surfaces 19a and 19b as shown in FIG. 3, and measure the positional information of measurement stage MST (including, for example, at least the positional information in the X-axis and the Y-axis directions and the rotation information in the θz direction) by receiving the respective reflected lights, and supply the measurement results to main controller 20.

In the embodiment, however, position information within the XY plane (including the rotation information in the θz direction) of wafer stage WST (wafer table WTB) is mainly measured by an encoder system (to be described later) that includes the Y scales and the X scales described above and the like, and the measurement values of interferometers 16 and 126 are secondarily used in the cases such as when long-term fluctuation of the measurement values of the encoder system (e.g. due to deformation over time of the scales, or the like) is corrected (calibrated). Further, Y interferometer 16 is used for measuring the Y-position of wafer table WTB or the like near the unloading position or the loading position, for wafer replacement. Further, also in movement of wafer stage WST, for example, between a loading operation and an alignment operation, and/or between an exposure operation and an unloading operation, measurement information of interferometer system 118, that is, at least one of position information in directions of five degrees of freedom (the X-axis, Y-axis, θx, θy and θz directions) is used. Incidentally, at least part of interferometer system 118 (such as an optical system) may be arranged at the main frame that holds projection unit PU, or may also be arranged integrally with projection unit PU that is supported in a suspended state as is described above, however, in the embodiment, interferometer system 118 is to be arranged at the measurement frame described above.

Incidentally, instead of reflection surface 17a and reflection surface 17b, a movable mirror consisting of a plane mirror can be arranged in wafer table WTB. Furthermore, positional information of wafer stage WST was to be measured with a reflection surface of a fixed mirror arranged in projection unit PU serving as a reference surface, however, the position to place the reference surface at is not limited to projection unit PU, and the fixed mirror does not always have to be used to measure the positional information of wafer stage WST.

Further, in the embodiment, positional information of wafer stage WST measured by interferometer system 118 is not used in the exposure operation and the alignment operation which will be described later on, and was mainly to be used in calibration operations (more specifically, calibration of measurement values) of the encoder system, however, the measurement information (more specifically, at least one of the positional information in directions of five degrees of freedom) of interferometer system 118 can be used in the exposure operation and/or the alignment operation. In the embodiment, the encoder system measures positional information of wafer stage WST in directions of three degrees of freedom, or more specifically, the X-axis, the Y-axis, and the θz directions. Therefore, in the exposure operation and the like, of the measurement information of interferometer system 118, positional information related to a direction that is different from the measurement direction (the X-axis, the Y-axis, and the θz direction) of wafer stage WST by the encoder system, such as, for example, positional information related only to the θx direction and/or the θy direction can be used, or in addition to the positional information in the different direction, positional information related to the same direction (more specifically, at least one of the X-axis, the Y-axis, and the θz directions) as the measurement direction of the encoder system can also be used. Further, interferometer system 118 can also be made to measure positional information of wafer stage WST in the Z-axis direction. In this case, positional information in the Z-axis direction can be used in the exposure operation and the like.

In exposure apparatus 100 of the embodiment, a plurality of head units configuring encoder system 150 to measure the position (X, Y, θz) of wafer stage WST in the XY plane is provided, independently from interferometer system 118.

As shown in FIG. 4, four head units 62A, 62B, 62C and 62D are placed on the +X side, +Y side, and −X side of nozzle unit 32, and the −Y side of primary alignment system AL1 unit 32, respectively. Further, as shown in FIG. 5, head units 62E and 62F are placed on the outer side on both sides in the X-axis direction of alignment system AL1 and AL2$_1$ to AL2$_4$, respectively. These head units 62A to 62F are fixed to the mainframe (not shown) previously described holding projection unit PU in a suspended state, via a support member. Incidentally, for example, in the case projection unit PU is supported in a suspended state, head units 62A to 62D may be supported in a suspended state integrally with projection unit PU, or may be arranged at the measurement frame described above.

Head units 62A and 62C are equipped with a plurality of (nine, in this case) Y heads 65$_1$ to 65$_9$ and 64$_1$ to 64$_9$, as shown in FIG. 5, respectively. In this case, Y heads 65$_2$ to 65$_5$ and Y heads 64$_1$ to 64$_4$ are placed spaced at a distance WD on reference axis LH. Y head 65$_2$ and Y head 64$_5$ are placed at a position on the −Y side of nozzle unit 32 spaced apart in the −Y direction by a predetermined distance from reference axis LH. The distance between heads 65$_1$ and 65$_2$ and heads 64$_4$ and 64$_5$ in the X-axis direction is also set to WD. Incidentally, Y heads 65$_1$ to 65$_5$ and Y heads 64$_5$ to 64$_1$ are placed symmetrically with respect to reference axis LV. Hereinafter, heads 65$_1$ to 65$_5$ and heads 64$_1$ to 64$_5$ will also be described as head 65 and head 64, respectively, as necessary.

Head unit 62A constitutes a multiple-lens (five-lens, in this case) Y linear encoder (hereinafter, shortly referred to as a "Y encoder" or an "encoder" as appropriate) 70A (refer to FIG. 7) that measures the position of wafer stage WST (wafer table WTB) in the Y-axis direction (Y position), using Y scale 39Y$_1$. Similarly, head unit 62C constitutes a multiple-lens (five-lens, in this case) Y encoder 70C (refer to FIG. 7) that measures the Y-position of wafer stage WST (wafer table WTB) using Y scale 39Y$_2$.

In this case, distance WD in the X-axis direction of the adjacent Y heads 64 and 65 (to be more accurate, the irradiation points of the measurement beams generated by Y heads 65 and 64 on the scale) that head units 62A and 62C are each equipped with, is set slightly narrower than the width (to be more precise, the length of grid line 38) of Y scales 39Y$_1$ and 39Y$_2$ in the X-axis direction. Accordingly, on exposure and the like, for example, of the respective five Y heads 65 and 64, at least one head constantly faces (irradiates a measurement beam on) the corresponding Y scales 39Y$_1$ and 39Y$_2$.

Head unit 62B is equipped with a plurality of (in this case, four) X heads 66$_5$ to 66$_8$ that are placed on reference axis LV at distance WD, as shown in FIG. 5. Further, head unit 62D is equipped with a plurality of (in this case, four) X heads 66$_1$ to 66$_4$ that are placed on reference axis LV at distance WD. In the following description, X heads 66$_5$ to 66$_8$ and X heads 66$_1$ to 66$_4$ are also described as X head 66, when necessary.

Head unit 62B constitutes a multiple-lens (four-lens, in this case) X linear encoder (hereinafter, shortly referred to as an "X encoder" or an "encoder" as needed) 70B (refer to FIG. 7) that measures the position in the X-axis direction (the X-position) of wafer stage WST (wafer table WTB) using X scale 39X$_1$. Further, head unit 62D constitutes a multiple-lens (four-lens, in this case) X linear encoder 70D (refer to FIG. 7) that measures the X-position of wafer stage WST (wafer table WTB) using X scale 39X$_2$.

Here, distance WD between adjacent X heads 66 (to be more accurate, the irradiation point of the measurement beam generated by X head 66 on the scale) in the Y-axis direction that are equipped in each of head units 62B and 62D is set shorter than the width of X scales $39X_1$ and $39X_2$ (to be more accurate, the length of grid line 37) in the Y-axis direction. Further, the distance between X head $66_5$ farthest to the −Y side of head unit 62B and X head $66_4$ farthest to the +Y side of head unit 62D is set slightly narrower than the width of wafer table WTB in the Y-axis direction so that switching (linkage described below) becomes possible between the two X heads by the movement of wafer stage WST in the Y-axis direction. Accordingly, for example, on exposure and the like, at least one of the X heads 66 equipped in head units 62B and 62D constantly faces (irradiates a measurement beam on) the corresponding X scales ($39X_1$ and $39X_2$).

Head unit 62F is equipped with a plurality of (in this case, four) Y heads $67_1$ to $67_4$, as shown in FIG. 5. In this case, three Y heads $67_1$ to $67_3$ are placed on the −X side of secondary alignment system $AL2_1$, at substantially the same distance as distance WD on reference axis LA. Y head $67_4$ is placed on the +Y side of secondary alignment system $AL2_1$ which is set a predetermined distance away from reference axis LA in the +Y direction. Incidentally, the distance between Y heads $67_3$ and $67_4$ in the X-axis direction is also set to a distance substantially the same as distance WD.

Head unit 62F is equipped with a plurality of (in this case, four) Y heads $68_1$ to $68_4$. These Y heads $68_1$ to $68_4$ are placed at positions symmetric to Y heads $67_4$ to $67_1$ with respect to reference axis LV. Hereinafter, Y heads $67_1$ to $67_4$ and heads $68_1$ to $68_4$ will also be described as Y head 67 and Y head 68, as necessary.

On alignment measurement and the like, at least one each of Y heads 67 and 68 face Y scales $39Y_2$ and $39Y_1$, respectively. The Y position (and $\theta z$ rotation) of wafer stage WST is measured by these Y heads 67 and 68 (more specifically, Y encoders 70E and 70F configured by Y heads 67 and 68).

Further, in the embodiment, at the time of baseline measurement and the like of the secondary alignment system, head $67_3$ and $68_2$ which are adjacent to the secondary alignment systems $AL2_1$ and $AL2_4$ in the X-axis direction face a pair of reference gratings 52 of FD bar 46, respectively, and by heads $67_3$ and $68_2$ that face the pair of reference gratings 52, the Y position of FD bar 46 is measured at the position of each reference grating 52. In the description below, the encoders configured by Y heads $67_3$ and $68_2$ which face a pair of reference gratings 52, respectively, are referred to as Y linear encoders 70E and 70F (refer to FIG. 7). Further, for identification, the Y linear encoder configured by Y heads 67 and 68 that face Y scales $39Y_2$ and $39Y_1$, will be referred to as encoders $70E_1$ and $70F_1$.

The measurement values of encoders 70A to 70F described above are supplied to main controller 20, and main controller 20 controls the position within the XY plane of wafer table WTB based on three measurement values of encoders 70A to 70D or on three measurement values of encoders $70E_1$, $70F_1$, 70B, and 70D, and also controls the rotation in the θz direction of FD bar 46 (measurement stage MST) based on the measurement values of encoders $70E_2$ and $70F_2$.

Figure 6:
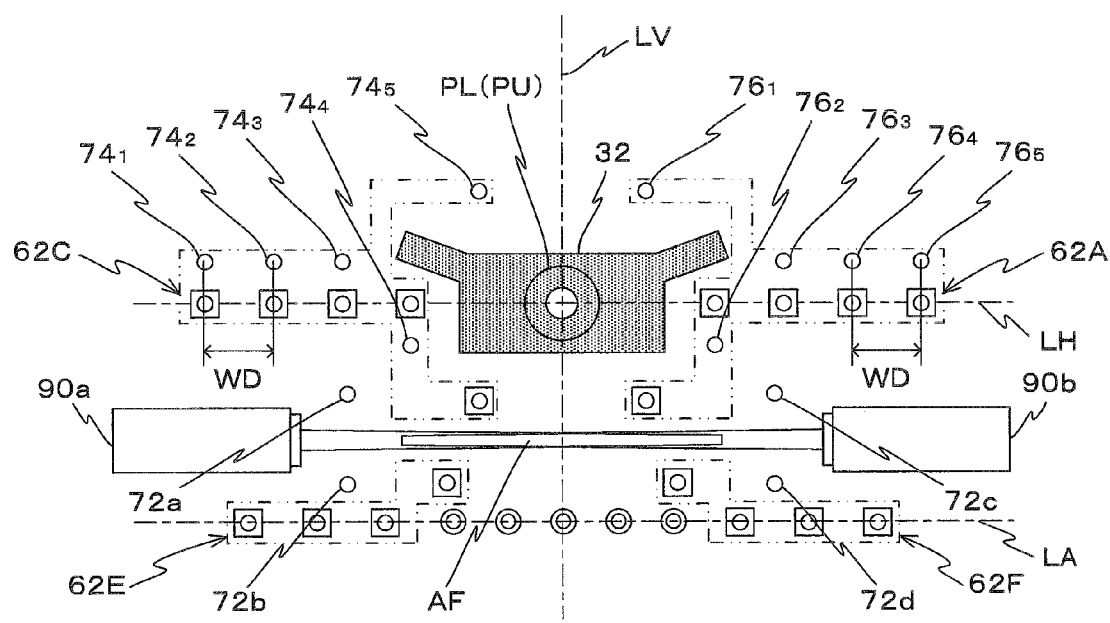
FIG. 6 is a planar view showing a placement of a 3 head and a multipoint AF system.
Figure 6:
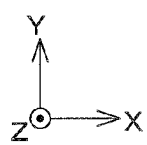

In exposure apparatus 100 of the embodiment, as shown in FIGS. 4 and 6, a multipoint focal position detecting system (hereinafter, shortly referred to as a "multipoint AF system") by an oblique incident method is arranged, which is composed of an irradiation system 90a and a photodetection system 90b, having a configuration similar to the one disclosed in, for example, U.S. Pat. No. 5,448,332 and the like. In the embodiment, as an example, irradiation system 90a is placed on the −Y side of the −X end portion of head unit 62C and photodetection system 90b is placed on the −Y side of the +X end portion of head unit 62A in a state of opposing irradiation system 90a.

A plurality of detection points of the multipoint AF system (90a, 90b) are placed at a predetermined distance along the X-axis direction on the surface to be detected. In FIGS. 4 and 6, the plurality of detection points to which a detection beam is severally irradiated are not individually shown, but are shown as an elongate detection area (beam area) AF that extends in the X-axis direction between irradiation system 90a and photodetection system 90b. Because the length of detection area AF in the X-axis direction is set to around the same as the diameter of wafer W, by only scanning wafer W in the Y-axis direction once, position information (surface position information) in the Z-axis direction across the entire surface of wafer W can be measured. Further, since detection area AF is placed between liquid immersion area 14 (exposure area IA) and the detection areas of the alignment systems (AL1, $AL2_1$, $AL2_2$, $AL2_3$ and $AL2_4$) in the Y-axis direction, the detection operations of the multipoint AF system and the alignment systems can be performed in parallel. The multipoint AF system may also be arranged on the main frame that holds projection unit PU or the like, but is to be arranged on the measurement frame described earlier in the embodiment.

Incidentally, a detection beam is to be irradiated to the plurality of detection points in the embodiment, but a detection beam may also be irradiated to, for example, the entire area of detection area AF. Furthermore, the length of detection area AF in the X-axis direction does not have to be nearly the same as the diameter of wafer W.

In exposure apparatus 100 of the embodiment, in the vicinity of detection points located at both ends out of a plurality of detection points of the multipoint AF system (90a, 90b) that is, in the vicinity of both end portions of detection area AF, heads 72a and 72b, and 72c and 72d of surface position sensors for Z position measurement (hereinafter, shortly referred to as "Z heads") are arranged each in a pair, in symmetrical placement with respect to reference axis LV, as is shown in FIG. 6. Z heads 72a to 72d are fixed to the lower surface of a main frame (not shown). Incidentally, Z heads 72a to 72d may also be arranged on the measurement frame described above or the like.

Furthermore, as shown in FIG. 6, head units 62A and 62C previously described are respectively equipped with Z heads $76_j$ and $74_i$ (i, j=1 to 5), which are five heads each, at the same X position as Y heads $65_j$ and $64_i$ (i, j=1 to 5) that head units 62A and 62C are respectively equipped with, with the Y position shifted. In this case, Z heads $76_3$ to $76_5$ and $74_1$ to $74_3$, which are three heads each on the outer side belonging to head units 62A and 62C, respectively, are placed parallel to reference axis LH a predetermined distance away in the +Y direction from reference axis LH. Further, Z heads $76_1$ and $74_5$, which are heads on the innermost side belonging to head units 62A and 62C, respectively, are placed on the +Y side of projection unit PU, and the remaining Z heads $76_2$ and $74_4$ are placed on the −Y side of Y heads $65_2$ and $64_4$, respectively. And five Z heads $76_j$ and $74_i$, which belong to head unit 62A and 62C, respectively, are placed symmetric to each other with respect to reference axis LV.

The distance of the five Z heads $76_j$ and $74_i$ (to be more accurate, the irradiation point of the measurement beam generated by the Z heads on the scale) in the X-axis direction that are equipped in each of head units 62A and 62C is set equal to distance WD of Y heads 65 and 64 in the X-axis direction. Accordingly, similar to Y heads 65 and 64, at the time of exposure and the like, of each five Z heads $76_j$ and $74_i$, at least one head constantly faces the corresponding Y scales $39Y_1$ and $39Y_2$.

As Z heads 72a to 72d, and $76_j$, and $74_i$, as an example, a head of an optical displacement sensor similar to an optical pickup used in a CD drive device is used. Z heads 72a to 72d, and 76$_j$, and 74$_i$ irradiate measurement beams to wafer table WTB from above, and by receiving the reflected lights, measure the surface position of wafer table WTB at the reflection points. Incidentally, in the embodiment, a configuration is employed where the measurement beams from the Z heads are reflected by the reflection grating configuring the Y scales 39Y$_1$ and 39Y$_2$ previously described.

Z heads 72a to 72d, Z heads 74$_1$ to 74$_5$, and Z heads 76$_1$ to 76$_5$ described above connect to main controller 20 via a signal processing/selection device 170, as shown in FIG. 7. Main controller 20 selects an arbitrary Z head from Z heads 72a to 72d, Z heads 74$_1$ to 74$_5$, and Z heads 76$_1$ to 76$_5$ via signal processing/selection device 170 and makes the head move into an operating state, and then receives the surface position information detected by the Z head which is in the operating state via signal processing/selection device 170. In the embodiment, a surface position measurement system 180 that obtains (measures) positional information of wafer stage WST in the Z-axis direction and the direction of inclination with respect to the XY plane is configured, including Z heads 72a to 72d, 74$_1$ to 74$_5$, and 76$_1$ to 76$_5$, and signal processing/selection device 170.

Main controller 20 measures the position coordinate of wafer stage WST in directions of two degrees of freedom (Z, θy), using surface position measurement system 180 in an effective stroke range of wafer stage WST, or in other words, within an area where wafer stage WST moves for alignment measurement and exposure operation.

FIG. 7 shows a block diagram showing an input/output relation of main controller 20, which centrally configures a control system of exposure apparatus 100. Main controller 20 includes a so-called microcomputer (or workstation) consisting of a CPU (Central Processing Unit), ROM (Read Only Memory), RAM (Random Access Memory) and the like, and has overall control over the entire apparatus. Incidentally, in FIG. 7, various sensors such as uneven illuminance measuring sensor 94, aerial image measuring instrument 96 and wavefront aberration measuring instrument 98 that are arranged at measurement stage MST are collectively shown as a sensor group 99.

In exposure apparatus 100 of the embodiment, by using encoder system 150 (refer to FIG. 7), main controller 20 can measure a position coordinate of wafer stage WST at least in directions of three degree of freedom (X, Y, θz), in the effective stroke range of wafer stage WST, or in other words, in the area where wafer stage WST moves for alignment and exposure operation.

A configuration of each encoder head of encoder system 150 and principles of position measurement and the like will now be further explained.

As a head of each encoder configuring a part of encoder system 150, an interference type encoder head made up of three sections which are an irradiation system, an optical system, and a photodetection system whose details are disclosed in, for example, U.S. Patent Application Publication No. 2008/0088843 can be used. With this encoder head, a laser beam emitted from a light source (e.g. semiconductor laser) is split by polarization by a polarization beam splitter in the optical system, and the two beams which are separated are irradiated on substantially the same area of the scale (a reflection diffraction grating) via a bending mirror, and by the irradiation of such beams, diffraction beams of a predetermined, order (e.g. a 1st order) generated from the diffraction grating are irradiated on a reflecting mirror via a λ/4 plate. And, the two diffraction beams which were reflected off the reflecting mirror, respectively, trace the same optical path as the proceeding path in the reversed direction and reach the polarization beam splitter, and then are synthesized coaxially at the polarization beam splitter, and enter the photodetection system. Then, the polarization directions of the two diffraction beams are uniformly arranged by the analyzer inside the photodetection system so that the beams interfere with each other to be an interference light, and the interference light is detected by the photodetector and is converted into an electric signal in accordance with the intensity of the interference light.

As is obvious from the above description, in the interference type encoder used in the embodiment, since the optical path lengths of the two beams to be interfered are extremely short and also are almost equal to each other, the influence by air fluctuations can mostly be ignored. Then, when the scale (more specifically, wafer stage WST) moves in a measurement direction (periodic direction of the diffraction grating), the phase of the two beams changes, respectively, which changes the intensity of the interference light. This change in the intensity of the interference light is detected by the photodetection system, and positional information corresponding to the intensity change is output as the measurement value of the encoder.

In exposure apparatus 100 of the embodiment, because the placement of the X scale and the Y scale on wafer table WTB and the placement of the encoder heads previously described was employed, in the effective stroke range (more specifically, in the embodiment, the range in which the wafer stage moves for alignment and exposure operation) of wafer stage WST, at least one X head 66 faces X scale 39$_1$ or 39X$_2$, at least one Y head 65 (or 68) faces Y scale 39Y$_1$, and at least one Y head 64 (or 67) faces Y scale 39Y$_2$, respectively, without fail. The encoder head facing the scale measures a position of wafer stage WST (to be more precise, a position of the scale where the measurement beam irradiates) in each measurement direction, with the position (to be more precise, a position of the irradiation point of the measurement beam) of the head serving as a reference. The measurement results are supplied to main controller 20 as measurement results of encoders 70A and 70C, and 70B or 70D (or, encoders 70E$_1$, 70F$_1$, and 70B or 70D).

Main controller 20 computes the position (X, Y, θz) within the XY plane of wafer stage WST, based on the measurement results of encoders 70A and 70C, and 70B or 70D (or, encoders 70E$_1$, 70F$_1$, and 70B or 70D). In this case, the measurement values (described as $C_X$, $C_Y^1$, and $C_Y^2$, respectively) of X head 66, and Y heads 65 and 64 (or 68 and 67) depend upon the position (X, Y, θz) of wafer stage WST as in formulas (1) to (3) below.

$$C_X = (p_X - X)\cos\theta z + (q_X - Y)\sin\theta z \tag{1}$$

$$C_Y^1 = -(p_Y^1 - X)\sin\theta z + (q_Y^1 - Y)\cos\theta z \tag{2}$$

$$C_Y^2 = -(p_Y^2 - X)\sin\theta z + (q_Y^2 - Y)\cos\theta z \tag{3}$$

However, $(p_X, q_X)$, $(p_Y^1, q_Y^1)$, and $(p_Y^2, q_Y^2)$ are X, Y setting positions (to be more precise, the X, Y positions of the irradiation point of the measurement beam) of X head 66, head 65 (or 68), Y head 64 (or 67), respectively. Therefore, main controller 20 substitutes the three measurement value $C_X$, $C_Y^1$, and $C_Y^2$ of the three heads into the simultaneous equations (1) to (3), and by solving the equations, computes the position (X, x, θz) of wafer stage WST in the XY plane Wafer stage WST is driven (position control is performed), according to the computation results.

Furthermore, main controller 20 switches and uses one X head 66 which faces X scale 39X$_1$ or 39X$_2$, one Y head 65 (or 68) which faces Y scale $39Y_1$, and one Y head 64 (or 67) which faces Y scale $39Y_2$, according to the position of wafer stage WST. In this case, when switching the encoder head, a linkage process to secure the continuity of the position measurement results of the wafer stage is performed, as is disclosed in, for example, U.S. Patent Application Publication No. 2009/0027640 and the like.

Further, main controller 20 controls the rotation in the θz direction of FD bar 46 (measurement stage MST), based on the measurement values of encoders $70E_2$ and $70F_2$. In this case, measurement values (each described as $C_Y^1$ and $C_Y^2$) of encoders $70E_2$ to $70F_2$ depend upon the position (X, Y, θz) of FD bar 46 as in formulas (2) and (3). Accordingly, the θz position of FD bar 46 is obtained as in formula (4) below by measurement values $C_Y^1$ and $C_Y^2$.

$$\sin \theta z = -(C_Y^1 - C_Y^2)/(p_Y^1 - p_Y^2) \quad (4)$$

However, as a premise, $q_Y^1 = q_Y^2$, for the sake of simply.

A drive (position control) of wafer stage WST employed in exposure apparatus 100 of the embodiment which uses a hybrid method by encoder system 150 and interferometer system 118 will be described.

As is previously described, because the influence of air fluctuation is extremely small with the encoder when compared to the interferometer, by using encoder system 150 (encoders 70A to 70F), in principle, wafer stage WST can be driven (the position controlled) with high accuracy. Further, because the encoder uses a scale, the encoder is superior from the viewpoint of measurement reproducibility. However, because of production errors and mechanical instabilities (drift of grating pitch, fixed position drift, thermal expansion and the like) of the scale, the encoder is inferior from the viewpoint of linearity.

Figure 8A:
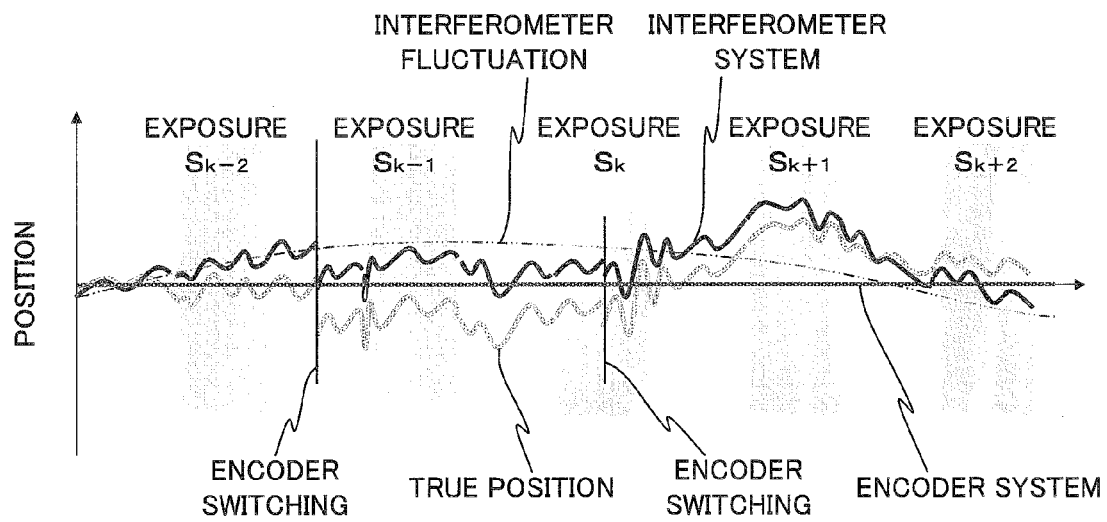
FIGS. 8A and 8B are views showing (a track of) a temporal change of a true position of a wafer stage and a position of a wafer stage indicated by an encoder system and an interferometer system at the time of a drive (position control) of the wafer stage using the encoder system and at the time of a drive in a hybrid manner using the encoder system and the interferometer system.
Figure 9A:
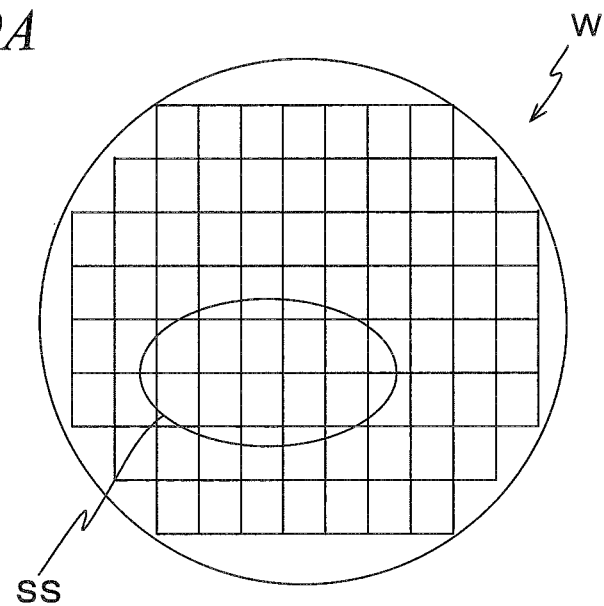
FIGS. 9A to 9C are views used to explain a shot deformation (pattern formation error) which occurs at a drive (position control) of the wafer stage using the encoder system.
Figure 9B:
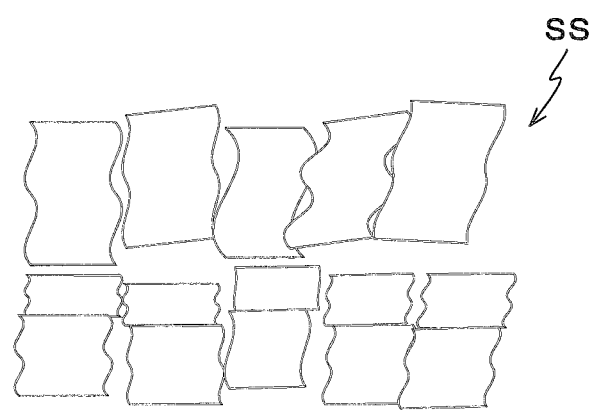

FIG. 8A shows (the track of) a temporal change of a true position (actual position) of wafer stage WST when driving (controlling the position of) wafer stage WST using encoder system 150, and (a measurement result of) a position of wafer stage WST given by encoder system 150 and interferometer system 118. In the example shown in FIG. 8A, because wafer stage WST is driven (position is controlled) based on measurement results of encoder system 150, the track of the actual position (true position) of wafer stage WST is fluctuated a little by the measurement errors which occur due to production errors and the like of the scale. Therefore, when wafer W shown in FIG. 9A is exposed by the step-and-scan method, it can be expected that the array of the shot areas arranged on the surface of wafer W will be altered (that is, a grid error occurs), and the shape of the shot areas will also be distorted (that is, a formation error of the pattern occurs), as shown in FIG. 9B.

Further, as is previously described, in encoder system 150 of the embodiment, the encoder heads are switched and used, according to the position of wafer stage WST. In this case, when an operation error (a linkage error) occurs in a linkage process performed at the time of switching, the measurement results of encoder system 150 is discontinuously altered, which in turn makes the true position of wafer stage WST become discontinuously altered (the track is discontinuously uneven), as is shown in FIG. 8A. Accordingly, when a linkage error occurs at the time of scanning exposure, it can be expected that a crack (more specifically, a crack of the pattern) will occur in the shot area as shown in FIG. 9B.

Further, by foreign materials such as water droplets, dust, flaws and the like adhering on the scale surface and scanning such foreign materials, output signals from an encoder (a head) can be cut off momentarily, or an abnormal signal can be output. When such an inconvenience occurs at the time of scanning exposure, it can be expected that a crack of the pattern will occur as in the case described above.

From the results of the prediction described above, at the time of scanning exposure to each shot area, it is desirable to use a stable sensor system which is superior in linear measurement and whose temporal change of the output signals is moderate at the time of abnormality generation, or which does not cause an abnormal operation which is accompanied by a temporal change of the output signals. In this point of view, it is desirable to use interferometer system 118, at the time of the scanning exposure. This is because as is shown in FIG. 8A using the two-dot chain line, although the measurement error (fluctuation error) of the interferometer due to air fluctuation is large, the time scale of air fluctuation is much longer when compared with the time scale of performing scanning exposure on one shot area, and when it is limited to the time of performing scanning exposure on one shot area, fluctuation error (to be more precise, variation in fluctuation error within the scanning exposure time) is sufficiently small.

On the contrary, because a high overlay accuracy of the pattern is required at the time of stepping between shot areas, it is desirable to use a sensor system which is superior in measurement accuracy, especially in measurement reproducibility. In this viewpoint, it is favorable to use encoder system 150 at the time of the stepping. Therefore, in the embodiment, a drive (position control) method of wafer stage WST by the hybrid method is employed which uses interferometer system 118 at the time of the scanning exposure and encoder system 150 at the time of stepping.

Figure 10:
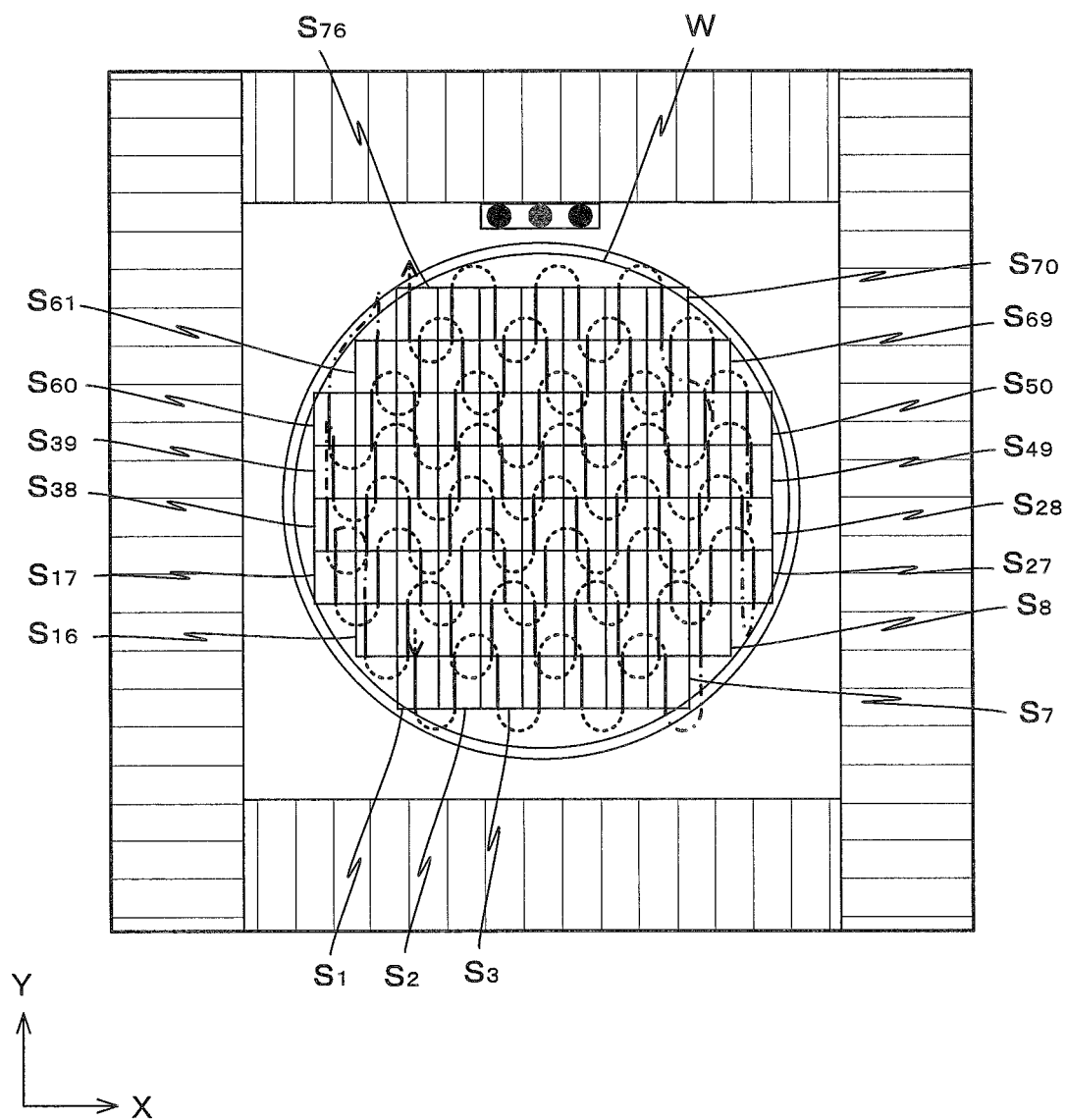
FIG. 10 is a planar view showing a movement track of a center of an exposure area on a wafer mounted on a wafer table.

In the embodiment, exposure is performed to N shot areas (N is, for example, 76) on wafer W as shown in FIG. 10, following a path shown in the drawing. Incidentally, the path shown in FIG. 10 shows a track of center P of exposure area IA (refer to FIG. 11A) when center P passes the area above each of the shot areas. The solid line section in this track shows a track of center P of exposure area IA in case of exposing each of the shot areas, the dotted line section (broken line section) shows a movement track of center P between adjacent shots in the same row in a non-scanning direction, and the dashed-line section shows a movement track of center P when center P moves between different rows. Incidentally, although center P of exposure area IA is fixed and wafer W moves in actual, for the sake of convenience, it is shown so that center P of exposure area IA moves with respect to a fixed wafer W.

Figure 11A:
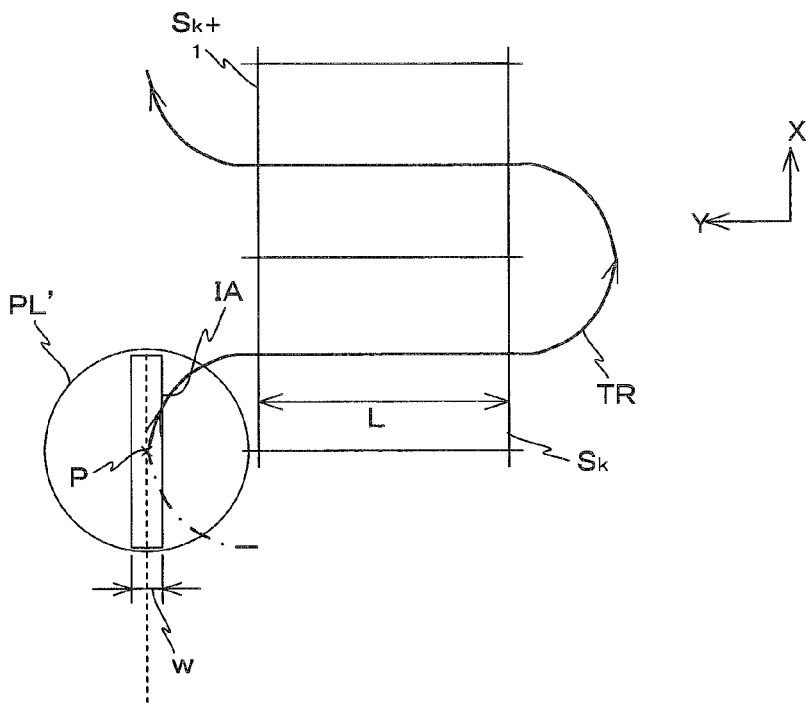
FIGS. 11A and 11B are views used to explain a hybrid stage drive (position control) method performed by an encoder system and an interferometer system at the time of exposure.
Figure 11B:
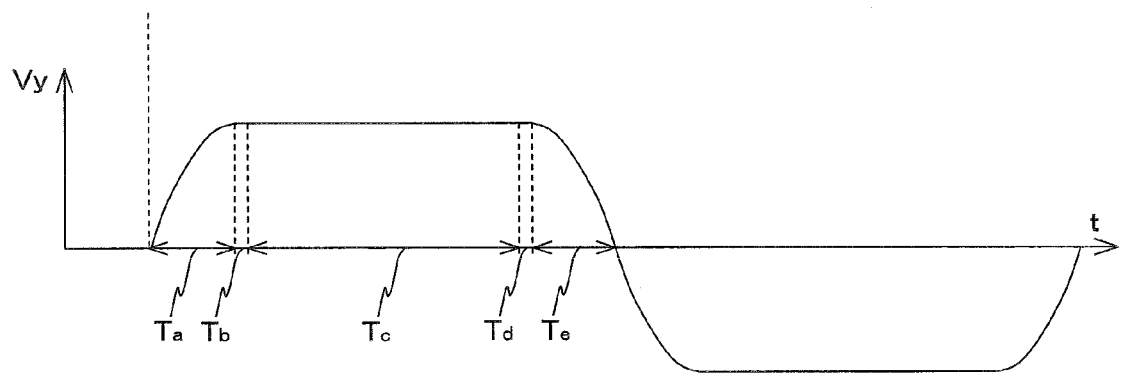

FIG. 11A shows a planar view of a relation between a slit shaped illumination area (an exposure area conjugate with illumination area IAR on reticle R) IA having a width w on wafer W inscribed in an effective field PL' of projection optical system PL and shot areas $S_k$ and $S_{k+1}$ having a shot length L, and FIG. 11B shows a relation between a movement time t of wafer stage WST and velocity Vy of wafer stage WST in the Y-axis direction. Incidentally, in actual, while exposure is performed by moving the shot area in a direction opposite to arrow TR with respect to exposure area IA, in FIG. 11A, in order to assign the relation between the movement time of wafer stage WST and velocity Vy of wafer stage WST in FIG. 11B, it is shown so that exposure area IA moves with respect to shot areas $S_k$ and $S_{k+1}$.

Main controller 20 moves wafer stage WST to an acceleration starting position for exposure of shot area $S_k$, based on measurement results of encoder system 150. This moves center P of exposure area IA to a position a predetermined distance away from the edge section of shot area $S_k$ as is shown in FIG. 11A. When wafer stage WST reaches the acceleration starting position, main controller 20 starts a synchronous movement of wafer stage WST (wafer W) and reticle stage RST (reticle R). In other words, main controller 20 accelerates and drives wafer stage WST, and concurrently drives reticle stage RST which follows the movement of wafer stage WST, in a direction opposite to wafer stage WST also at a velocity which is a multiple of the inverse number of projection magnification β of the velocity of wafer stage WST. As shown in FIG. 11B, the velocity of both stages WST and WST becomes constant, after an acceleration time $T_a$ has passed from the beginning of acceleration.

After the acceleration has been completed, for a settling time $T_b$ until the beginning of exposure, main controller 20 drives reticle stage RST so that reticle stage RST follows wafer stage WST until a displacement error between wafer W and reticle R becomes a predetermined relation.

In parallel with this, main controller 20 switches from the drive (position control) of wafer stage WST using encoder system 150 to the drive (position control) of wafer stage WST using interferometer system 118. Now, main controller 20 performs a linkage process in order to secure the continuity of measurement results of the position of wafer stage WST before and after the switching. In other words, main controller calibrates a measurement result (X', Y', θz') of interferometer system 118 by adding an offset O so as to make the measurement result coincide with a measurement result (X, Y, θz) of encoder system 150. Details of this linkage process will be describer further in the description.

After the switching, main controller 20 drives wafer stage WST at a constant speed based, on the measurement results of interferometer system 118. This allows exposure area IA to move at a constant velocity from the +Y edge to the −Y edge of shot area $S_k$ during exposure time $T_c$ after settling time $T_b$, and scanning exposure of shot area $S_k$ is performed.

After the exposure has been completed, wafer stage WST moves in a constant velocity during a uniform velocity overseen time (postsettling time) $T_d$. During this movement, main controller 20 switches from the drive (position control) of wafer stage WST using interferometer system 118 to the drive (position control) of wafer stage WST using encoder system 150. Now, main controller 20 performs a linkage process as is previously described in order to secure the continuity of measurement results of the position of wafer stage WST before and after the switching.

After the switching, main controller 20 decelerates and drives wafer stage WST based on the measurement results of encoder system 150 during a deceleration overseen time $T_e$. Main controller 20 also decelerates and drives reticle stage RST simultaneously. Incidentally, in the deceleration overseen time $T_e$, wafer stage WST1 is driven in the X-axis direction as well, in parallel with being driven in the Y-axis direction. This makes center P of exposure area IA draw a U-shaped track from the −Y edge of shot area $S_k$ (hereinafter, this operation will also be referred to as a stepping).

After the deceleration of wafer stage WST has been completed, main controller 20 continues to drive wafer stage WST and reticle stage RST as is previously described, however, in opposite directions, and exposes the adjacent shot area $S_{k+1}$.

As is previously described, because measurement errors which occur due to production errors and the like of the scale are included in the measurement results of encoder system 150, interferometer system 118 will be calibrated taking in such measurement errors in a simple linkage process. Therefore, a principle of a linkage process which is suitable for exposure apparatus 100 of the embodiment that can avoid such inconveniences will be described below.

In the embodiment, the position coordinate of wafer stage WST is controlled by main controller 20 by a predetermined control sampling interval, such as for example, a time interval of, for example, 96 μsec. At each control sampling interval, a position servo control system (part of main controller 20) updates the current position of wafer stage WST, computes thrust command values and the like to position the stage to a target position, and outputs the results to stage drive system 124. As is previously described, the current position of wafer stage WST is computed from measurement values of encoder heads 64 to 68 configuring encoder system 150, or from measurement values of interferometers 16, 43A, 43B, and 126 to 128 configuring interferometer system 118. The measurement values of these encoders and interferometers are monitored at a time interval (measurement sampling interval) much shorter than the control sampling interval.

Figure 12:
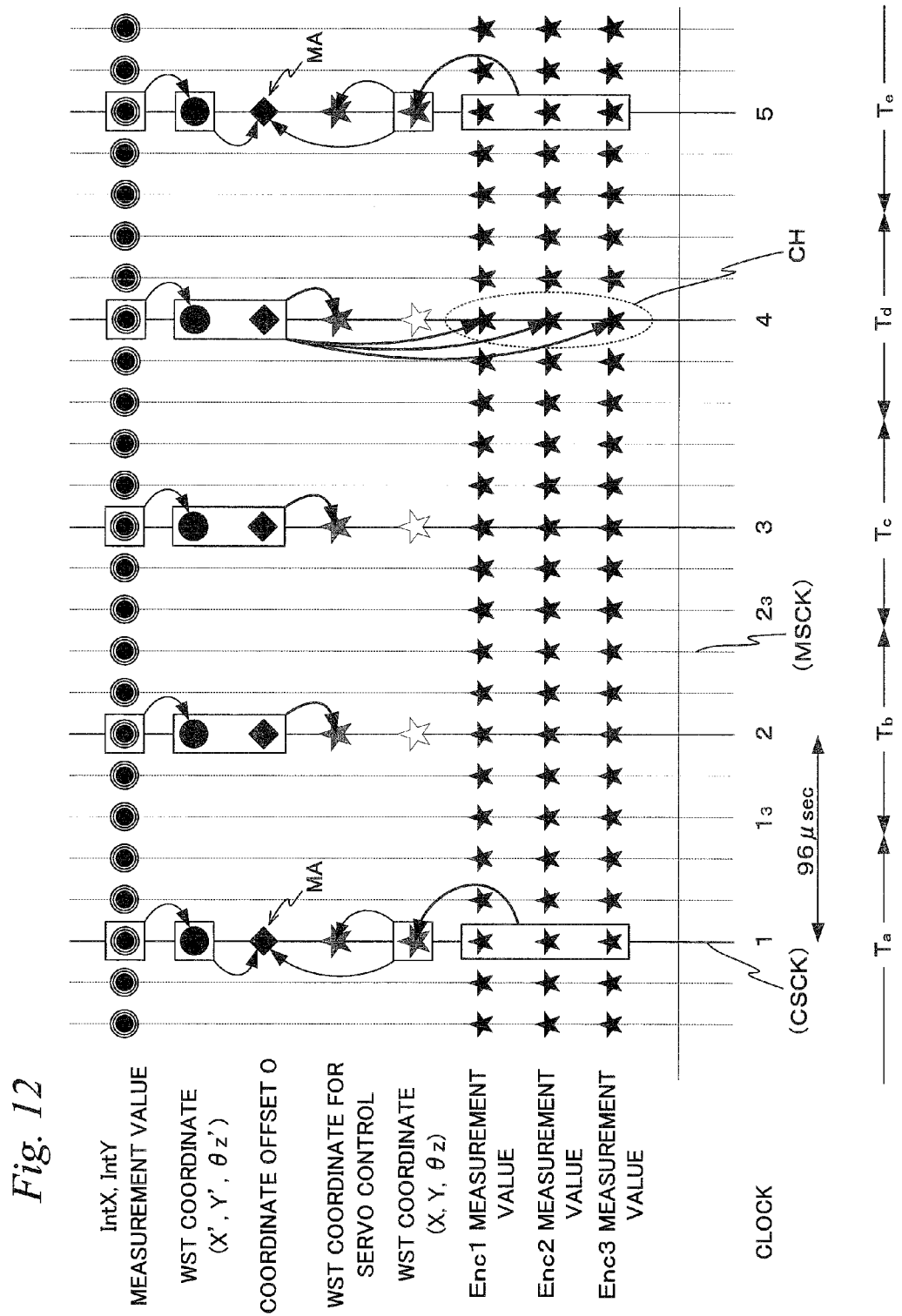
FIG. 12 is a view showing an outline of a linkage process on switching (and a reverse switching) from a servo control of the wafer stage by the encoder system to a servo control by the interferometer system.

FIG. 12 shows an outline of a switching between a drive (position control) by encoder system 150 and a drive (position control) by interferometer system 118, and a linkage process which accompanies the switching. Reference code CSCK in FIG. 12 indicates the generation timing of a sampling clock (a control clock) of the position control of wafer stage WST, and reference code MSCK indicates a generation timing of a sampling clock (a measurement clock) of the measurement of the encoder (and the interferometer).

Main controller 20 monitors an output signal of encoder system 150 (three encoders Enc1, Enc2, and Enc3 which are used to control the position of wafer stage WST in the XY plane) and interferometer system 118 (two interferometers IntX and IntY used to control the position of wafer stage WST in the XY plane) for each control clock (CSCK). Incidentally, in actual practice, the measurement clock of interferometer system 118 occurs more frequently than the measurement clock of encoder system 150, however, in this case, in order to avoid complication, only the measurement clock which occurs simultaneously is shown. At the time of control clock generation, main controller 20, for example, computes position coordinate (X, Y, θz) of wafer stage WST using simultaneous equations (1) to (3) or a formula (4) from the measurement values of encoder system 150 (Enc1, Enc2, and Enc3) as in the first control clock generation shown in FIG. 12, and also computes position coordinate (X', Y', θz') of wafer stage WST from the measurement values of interferometer system 118 (IntX, IntY).

At the time of stepping (acceleration time $T_a$ in FIG. 11B and deceleration overscan time $T_e$) on exposure by the step-and-repeat method previously described, main controller 20 outputs a stage position coordinate (X, Y, θz) computed from the measurement values of encoder system 150 (Enc1, Enc2, and Enc3) to stage drive system 124, as a stage coordinate for servo control to stage drive system 124, and drives (controls the position of) wafer stage WST.

Figure 8B:
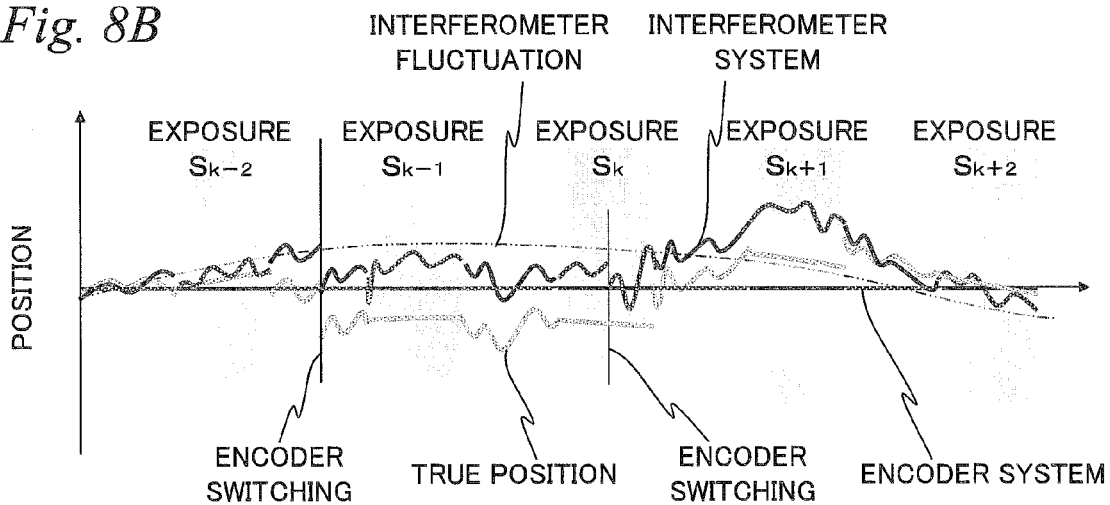

FIG. 8B shows (the track of) a temporal change of a true position (actual position) of wafer stage WST when driving (controlling the position of) wafer stage WST in a hybrid manner using encoder system 150 and interferometer system 118, and (a measurement result of) a position of wafer stage WST given by encoder system 150 and interferometer system 118. As described above, at the time of stepping between the exposure (exposures $S_{k-2}$ to $S_{k+2}$ in FIG. 5B) to shot areas to $S_{k+2}$, wafer stage WST is driven (position is controlled) based on the measurement values of encoder system 150. Therefore, by measurement errors which occur due to production errors and the like of the scale as in the example in FIG. 8A, the track of the position of wafer stage WST fluctuates minutely. Further, the track fluctuates discontinuously, by a linkage error, an error which comes with scanning foreign materials and the like. However, by the high measurement reproducibility of the encoder, the shape of the track will be reproduced with high probability even when repeating the exposure of the wafer many times, or in other words, wafer stage WST will perform the step movement on almost the same track.

Main controller 20 performs preprocessing for a linkage process for every control clock (CSCK), simultaneously with the stage drive (position control) using the measurement results of encoder system 150 described above. In other words, main controller 20 obtains a difference between position coordinate (X, Y, θz) and position coordinate (X', Y', θz') as shown in FIG. 12, and furthermore obtains a moving average MAK (X, Y, θz)–(X', Y', θz') of the difference for a predetermined clock number, which is held as a coordinate offset O. However, in FIG. 12, the computing of the moving average of the difference is expressed using reference code MA.

Main controller 20 switches from driving (position control of) wafer stage WST using encoder system 150 to driving (position control of) wafer stage WST using interferometer system 118 when the second control clock generation occurs during settling time $T_b$ (refer to FIG. 11B), which is after completing the acceleration of wafer stage WST in the exposure by the step-and-scan method previously described until the beginning of exposure. On the switching, main controller 20 performs a linkage process. More specifically, main controller 20 adds the coordinate offset O kept in the first control clock generation just before to the position coordinate (X', Y', θz') of wafer stage WST computed from the measurement results of interferometer system 118 at the time of the second control clock generation, so that the position coordinate coincides with the position coordinate (X, Y, θz) of wafer stage WST computed from the measurement values of encoder system 150 at the time of control clock generation (in this case, at the time of the first control clock generation) just before.

In this case, when performing an offset correction on a position coordinate (X', Y', θz') of wafer stage WST, the value of coordinate offset O should be confirmed to be sufficiently stable for the most recent predetermined clock number. Furthermore, as is previously described, the position coordinate (X, Y, θz) of wafer stage WST1 computed from the measurement values of encoder system 150 fluctuates slightly with respect to the true position by measurement errors which occur due to the production error of the scale and the like. Therefore, the offset correction should be performed at a timing (at the time of clock generation) where the difference between position coordinate (X, Y, θz) of wafer stage WST computed from the measurement values of encoder system 150 and position coordinate (X', Y', θz') of wafer stage WST computed from the measurement values of interferometer system 118 coincides or almost coincides with coordinate offset O which is sufficiently stable.

During exposure time $T_c$, main controller 20 outputs position coordinate {(X', Y', θz')+O} on which offset correction has been performed to stage drive system 124, and drives (controls the Position of) wafer stage WST. By this, as shown in FIG. 8B, although the track of the position of wafer stage WST in exposure of $S_{k-2}$ to $S_{k+2}$ is slightly off the origin (target position) of the measurement errors of encoder system 150, because of the long time scale of the fluctuation error, the track becomes a straight line with almost no tilt, or a straight line with only a slight tilt. More specifically, wafer stage WST is driven (position is controlled) with high linearity during the scanning exposure (during exposure time $T_c$).

When exposure time $T_c$ has passed and after scanning exposure to shot area $S_k$ is completed, main controller 20 switches from the drive (position control) of wafer stage WST using interferometer system 118 to the drive (position control) of wafer stage WST using encoder system 150, in the fourth control clock generation during uniform velocity overscan time (postsettling time) $T_d$. At this point, main controller 20 performs a reverse linkage process. More specifically, main controller 20 substitutes a position coordinate [(X', Y', θz')+O] on which offset correction has been performed into simultaneous equations (1) to (3) and computes the measurement values which each encoder Enc1, Enc2, and Enc3 should indicate, and initializes the encoders. In FIG. 12, this reverse linkage process is shown by reference code CH.

From the next fifth control clock generation onward, main controller 20 performs the servo control by encoder system 150, similar to the time of the first clock generation. At the same time, main controller 20 begins to update coordinate offset O again.

Incidentally, in the description so far, while three heads Enc1, Enc2, and Enc3 were taken up abstractly among encoders (heads) that configure encoder system 150 so as to describe the principle of the drive (position control) method of wafer stage WST which employs the hybrid method using encoder system 150 and interferometer system 118 in the embodiment, encoders Enc1 and Enc2 are either Y heads 65 and 64 of head units 62A and 62C and Y heads 67 and 68 of head units 62E and 62F, and Enc3 is X head 66 of head units 62B and 62D, which are representatively shown. Further, X interferometers 126 to 128 and Y interferometer 18 which configure interferometer system 118 are abstractly described as IntX and IntY.

Figure 9C:
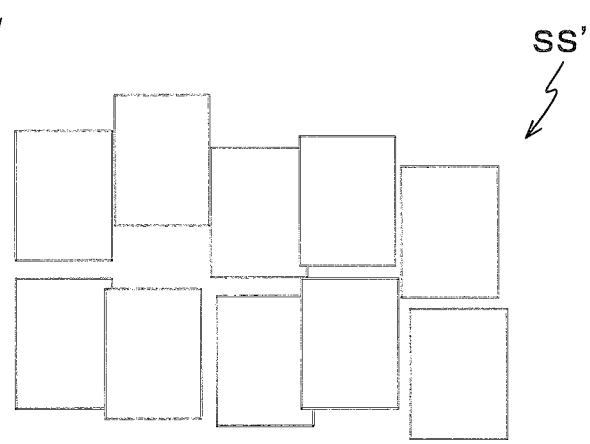

Because the linear measurement of the position of wafer stage WST at the time of scanning exposure is secured by employing the drive (position control) method of wafer stage WST by the hybrid method described above, distortion of the shape of the shot area or in other words, the formation error of the pattern is canceled, as shown in FIG. 9C. Furthermore, distortion of the shot areas arranged occurring due to the measurement errors of encoder system 150, or in other words, grid errors, can easily be canceled by correcting the acceleration starting position with respect to each of the shot areas $S_k$ due to the high measurement reproducibility of encoder system 150.

Incidentally, an offset for each of the X-axis direction, the Y-axis direction, and the θz direction of the acceleration start position are to be obtained in advance with respect to all of the shot areas $S_k$. At the time of stepping, a target position to drive wafer stage WST to the next acceleration starting position, or in other words, the shot arrangement (the position of the individual shot areas) obtained by an alignment measurement is corrected, using the offset. This allows the acceleration starting position to be corrected, which in turn allows the remaining grid errors to be canceled easily. In addition, grid errors can be canceled, for example, as is disclosed in, Kokai (Japanese Patent Unexamined Application Publication) No. 4-127514 and the like, by driving a lens element configuring projection optical system PL, or as is disclosed in, for example, Kokai (Japanese Patent Unexamined Application Publication) No: 2005-466951 and the like, by finely correcting the synchronous drive of reticle stage RST and wafer stage WST.

With exposure apparatus 100 of the embodiment, by using surface position measurement system 180 (refer to FIG. 7), main, controller 20 can measure the position coordinate at least in directions of two degrees of freedom (Z, θy) in an effective stroke area of wafer stage WST.

A configuration of each Z head of surface position measurement system 180 and principles of position measurement and the like will now be further explained.

In the embodiment, main controller 20 uses one each of the Z heads $74_i$, $76_j$ (i and j are one of 1 to 5) belonging to head units 62C and 62A and measures height Z and tilt (rolling) θy of wafer table WTB at the time of exposure. Further, main controller 20 uses the four Z heads 70a to 70d at the time of focus mapping in which the unevenness information of the wafer W surface is measured with the upper surface of wafer table WTB serving as a reference prior to exposure, and measures height Z and tilt (rolling) θy of wafer table WTB, As each of the Z heads $72a$ to $72d$, $74_1$ to $74_5$, and $76_1$ to $76_5$, a sensor head having a configuration in which a measurement beam is irradiated on a surface of a reflection grating formed on a measurement surface, or in other words, on one of the corresponding Y scale $39Y_1$ or $39Y_2$, the reflected light is received, and the sensor is made to follow the head main body in the measurement direction so as to maintain the measurement surface at the best focus position of the focus sensor inside the head main body. From this sensor head, a reading of the displacement in the measurement direction of the head main body is output as surface position (a Z position) of the measurement plane.

Figure 13:
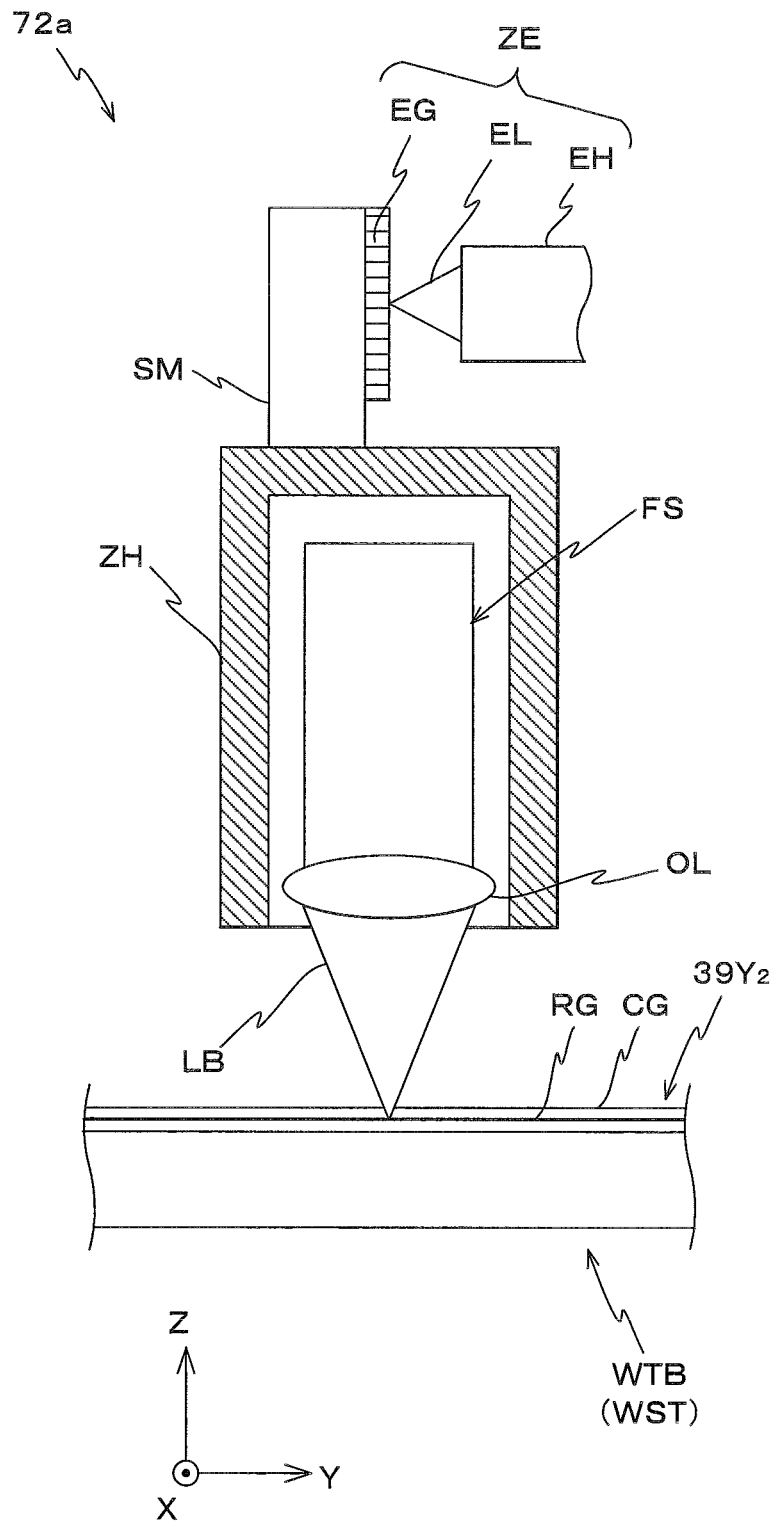
FIG. 13 is a view schematically showing an example of a configuration of a Z head.

Now, the configuration and the like of Z heads $72a$ to $72d$, $74_1$ to $74_5$, and $76_1$ to $76_5$ will be described further in detail, focusing on Z head $72a$ shown in FIG. 13 as a representative. In FIG. 13, a detection light (measurement beam) LB is irradiated on Y scale $39Y_2$ from Z head $72a$. In FIG. 13, reference code CG indicates a cover glass.

As shown in FIG. 13, Z head 72a is equipped with a focus sensor FS, a sensor main section Z 3 which houses focus sensor FS, a drive section (not shown) which drives sensor main section Z11 in the Z-axis direction, a measurement section ZE which measures displacement of sensor main section ZH in the Z-axis direction and the like.

As focus sensor FS, a focus sensor by the pickup method is used which irradiates measurement beam LB on a measurement subject plane, and by receiving the reflected light, optically reads the displacement of the measurement subject plane. The output signal of focus sensor FS is sent to the drive section (not shown).

The drive section (not shown) includes an actuator such as, for example, a voice coil motor, and one of a mover and a stator of the voice coil motor is fixed to sensor main section ZH, and the other is fixed to a part of a housing not shown) which houses the sensor main section ZH, measurement section ZE and the like, respectively. The drive section drives sensor main section ZH in the Z-axis direction based on the output signals from focus sensor FS so that the distance between sensor main section ZH and the measurement subject plane is constantly maintained (or to be more precise, so that the measurement subject plane is maintained at the best focus position of the optical system of focus sensor FS). By this drive, sensor main section ZH follows the displacement of the measurement subject plane in the Z-axis direction, and a focus lock state is maintained.

As measurement section ZE, in the embodiment, an encoder by the diffraction interference method similar to encoders 70A to 70F is used as an example. Measurement section ZE includes a reflective diffraction grating EG whose periodic direction is the Z-axis direction arranged on a side surface of a support member SM fixed on the upper surface of sensor main section ZH extending in the Z-axis direction, and an encoder head EH which is attached to the housing (not shown) facing diffraction grating EG, Encoder head EH reads the displacement of sensor main section ZH in the Z-axis direction by irradiating measurement beam EL on diffraction grating EG, receiving the reflection/diffraction light from diffraction grating EG with a light-receiving element, and reading the deviation from the origin of an irradiation point of measurement beam EL. Measurement values of encoder head EH is supplied to main controller 20 via signal processing/selection device 170 previously described as measurement values of Z head 72a.

At the time of exposure, main controller 20 computes height $Z_0$ and rolling amount (angle) θy of wafer stage WST at the reference point (an intersecting point of the table surface and optical axis AX) on the table surface, based on the measurement values of at least one each of Z heads $74_i$ and $76_j$ (i, j are anyone of 1 to 5). In this case, measurement values (each described as $Z_L$ and $Z_R$) of Z heads $74_i$ and $76_j$ (i, j are any one of 1 to 5) depend upon a ($Z_0$, θx, θy) position of wafer stage WST, as in formulas (7) and (8).

$$Z_L = -\tan θy \cdot p_L + \tan θx \cdot q_L + Z_0 \quad (7)$$

$$Z_R = -\tan θy \cdot p_R + \tan θx \cdot q_R + Z_0 \quad (8)$$

However, the upper surface of wafer table WTB including the measurement plane is to be an ideal plane. Incidentally, ($p_L$, $q_L$) and ($p_R$, $q_R$) are each the X and Y setting positions (to be more precise, the X, Y positions of the irradiation point of the measurement beam)) of Z heads $74_i$ and $76_j$. By formulas (7), (8), the following formulas (9) and (10) are derived.

$$Z_0 = [Z_L + Z_R - \tan θx(q_L + q_R)]/2, \quad (9)$$

$$\tan θy = [Z_L - Z_R - \tan θx(q_L - q_R)]/(p_R - p_L) \quad (10)$$

Accordingly, main controller 20 computes height $Z_0$ and rolling amount θy of wafer stage WST from formulas (9) and (10), using measurement values $Z_L$ and $Z_R$ of Z heads $74_i$ and $76_j$. However, pitching amount (angle) θx uses the measurement results of another sensor system (in the embodiment, interferometer system 118).

Furthermore, main controller 20 switches and uses one Z head $76_j$ facing Y scale $39Y_1$ and one Z head $74_i$ facing Y scale $39Y_2$, depending on the X, Y position of wafer stage WET. In this case, when switching the Z head, a linkage process to secure the continuity of the measurement results of the $Z_0$ and θy positions of wafer stage WET is performed, as is disclosed in, for example, U.S. Patent Application Publication No. 2009/0053629 and the like.

At the time of focus mapping and the like, main controller 20 computes height $Z_0$ and rolling amount θy of wafer table WTB in the center (X, Y)=(Ox', Oy') of a plurality of detection points of multipoint AF system (90a, 90b) by formulas (11) and (12) below, based on measurement values (described as Za, Zb, Zc, and Zd, respectively) of the four Z heads 72a to 72d.

$$Z_0 = (Za + Zb + Zc + Zd)/4 \quad (11)$$

$$\tan θy = -(Za + Zb - Zc - Zd)/(p_a + p_b - p_c - p_d) \quad (12)$$

Now, ($p_a$, $q_a$), ($p_b$, $q_b$), ($p_c$, $q_c$), and ($p_d$, $q_d$) are each the X and Y setting positions (to be more precise, the X, Y positions of the irradiation point of the measurement beam)) of Z heads 72a to 72d. However, $p_a = p_b$, $p_c = p_d$, $q_a = q_c$, $q_b = q_d$, ($p_a + p_c$)/2 = ($p_b + p_d$)/2 = Ox', ($q_a + q_b$)/2 = ($q_c + q_d$)/2 = Oy'. Incidentally, pitching amount θx uses the measurement results of another sensor system (in the embodiment, interferometer system 118) as in the previous description.

In exposure apparatus 100 of the embodiment, as well as driving (controlling the position of) wafer stage WST by the hybrid method using encoder system 150 and interferometer system 118 previously described, a drive (focus leveling control) of wafer stage WST by a hybrid method using surface position measurement system 180 and interferometer system 118 is employed.

With the Z heads used in the embodiment, because the optical path length of measurement beam LB in the atmosphere is extremely short as is described above, the influence of air fluctuation can mostly be ignored. Accordingly, by using surface position measurement system 180, in principle, focus leveling control of wafer stage WST (wafer W) can be performed with high accuracy. However, because of production errors (unevenness of the reflection surface) of the measurement plane (scale), Z heads are inferior from the viewpoint of linearity like the encoders.

Further, as is previously described, in surface position measurement system 180 of the embodiment, the Z heads are switched and used, according to the position of wafer stage WST. In this case, when an operation error (a linkage error) occurs in a linkage process performed at the time of switching, the measurement results of surface position measurement system 180 is discontinuously altered. Further, by foreign materials such as water droplets, dust, flaws and the like adhering on the measurement plane (scale) and scanning such foreign materials, output signals from the Z head can be cut off momentarily, or an abnormal signal can be output. When such an inconvenience occurs at the time of scanning exposure, it can be expected that a crack in the shot area (a crack of the pattern) will occur as is shown in FIG. 9B.

Therefore, in the embodiment, a Z tilt drive (focus leveling control) method of wafer stage WST by a hybrid method is employed, which uses interferometer system 118 at the time of scanning exposure and surface position measurement system 180 at the time of stepping.

As shown in FIG. 11A, main controller 20 moves wafer stage WST to an acceleration start position for exposure of shot area $S_k$ based on measurement results of encoder system 150, and also performs focus leveling control of wafer stage WST (wafer W), based on measurement results of surface position measurement system 180. Furthermore, when wafer stage WST reaches the acceleration starting position described above, Math controller 20 accelerates and drives wafer stage WST during acceleration time $T_a$ (refer to FIG. 11B).

After the acceleration has been completed, for a settling time $T_b$ (refer to FIG. 11B) until the beginning of exposure, main controller 20 switches the drive (position control) of wafer stage WST from the drive using encoder system 150 to the drive using interferometer system 118, and at the same time switches from the focus leveling control using surface position measurement system 180 to the focus leveling control to a focus leveling control using interferometer system 118. Now, main controller 20 performs a linkage process in order to secure the continuity of measurement results of the position of wafer stage WST before and after the switching. In other words, main controller calibrates a measurement result ($Z_0'$, θy') of interferometer system 118 by adding an offset O so as to make the measurement result coincide with a measurement result (X, Y, θz) of surface position measurement system 180. Details of this linkage process will be describer further in the description.

After the switching, main controller 20 drives wafer stage WST at a constant speed based on the measurement results of interferometer system 118, and performs focus leveling control. In this way, scanning exposure of shot area v is performed.

After the exposure has been completed, during uniform velocity overseen time (postsettling time) $T_d$, main controller 20 switches from the drive (position control) using encoder system 150, and at the same time, also switches to focus leveling control using surface position measurement system 180. Now, main controller 20 performs a linkage process as is previously described in order to secure the continuity of measurement results of the position of wafer stage WST before and after the switching.

After the switching, during a deceleration overseen time $T_e$, main controller 20 steps and drives wafer stage WST based on the measurement results of encoder system 150, and also at the same time, performs focus leveling control of wafer stage WST based on the measurement results of surface position system 180.

After the stepping drive, main controller 20 continues to expose the adjacent shot area $S_{k+1}$, as in the previous description.

As is previously described, because measurement errors which occur due to production errors and the like of the scale are included in the measurement results of surface position measurement system 180, in a simple linkage process, interferometer system 118 will be calibrated taking in such measurement errors. Therefore, a principle of a linkage process that can avoid such inconveniences will be described below.

Figure 14:
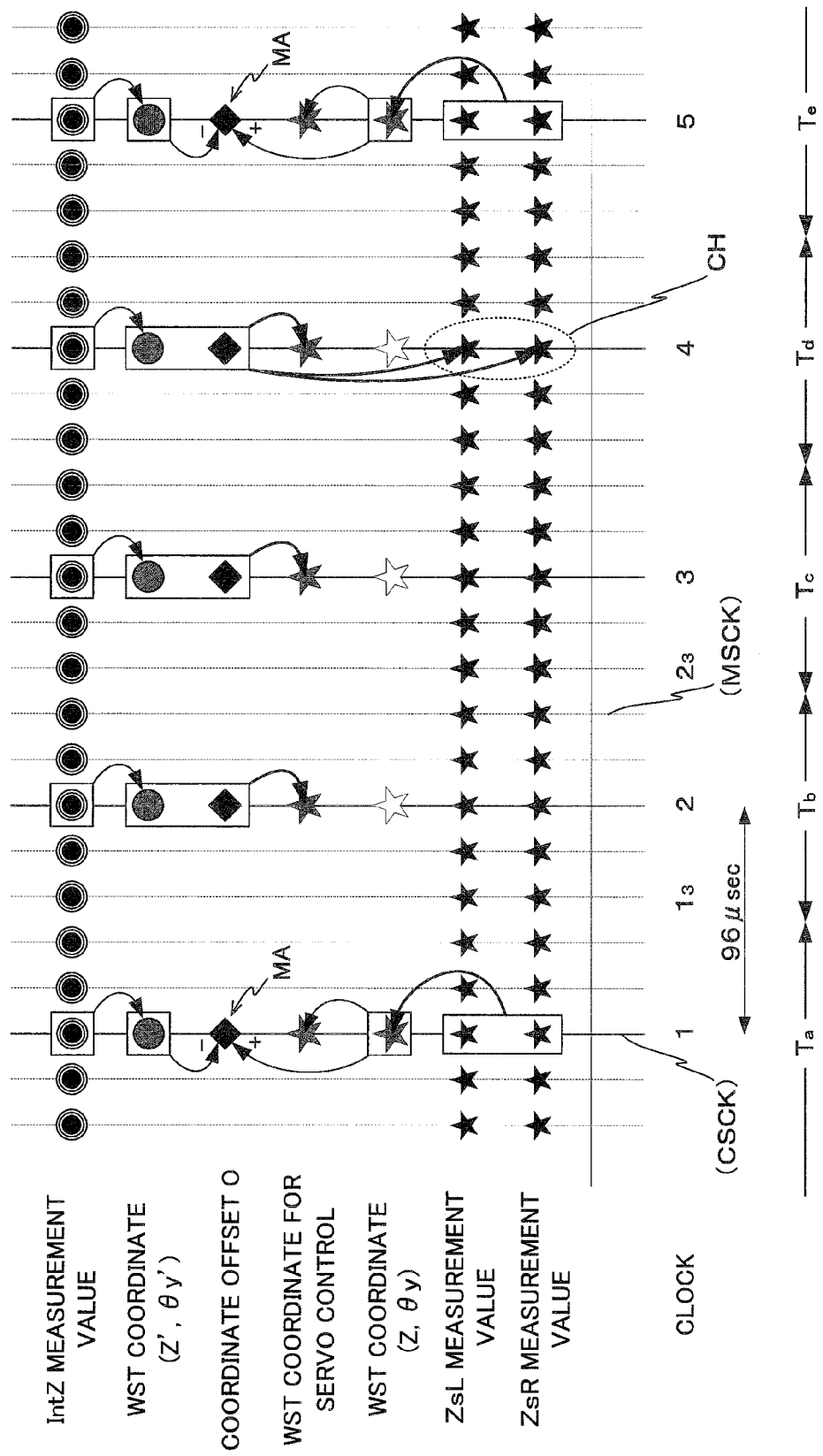
FIG. 14 is a view showing an outline of a linkage process in a switching to servo drive control of the wafer stage from a surface position measurement system to an interferometer system, and the interferometer system to the surface position measurement system.

As is previously described, in the embodiment, main controller 20 controls the position coordinates of wafer stage WST by a time interval of, for example, 96 μsec. The Z and θy positions of wafer stage WST are computed by measurement values of Z heads $74_i$ and $76_j$ (hereinafter shortly referred to as ZsL, and ZsR) configuring surface position measurement system 180 or measurement values of interferometer 43A and 43B (hereinafter shortly referred to as IntZ) configuring interferometer system 118, FIG. 14 is a view showing an outline of a linkage process in a switching (and a reversed switching) from focus leveling control of wafer stage WST by surface position measurement system 180 to focus leveling control of wafer stage WST by interferometer system 118.

Main controller 20 monitors the output signals of surface position measurement system 180 (Z heads ZsL and ZsR used in focus leveling control) and interferometer system 118 (interferometer IntZ used in focus leveling control) for each control clock (CSCK) generation. At the time of control clock generation, main controller 20 computes the position ($Z_o$, θy) of wafer stage WST from the measurement values of surface position measurement system 180 (ZsL, ZsR) using formulas (9) and (10) as in the time of first control clock generation, as well as compute position coordinate ($Z_o'$, θy') of wafer stage WST from the measurement values of interferometer system 118 (IntZ).

At the time of stepping (acceleration time $T_a$ in FIG. 11B and deceleration overscan time $T_e$) on exposure by the step-and-scan method previously described, main controller 20 outputs a stage position coordinate ($Z_o$, θy) computed from the measurement values of surface position measurement system 180 (ZsL, ZsR) to stage drive system 124, as a stage coordinate for servo control to stage drive system 124, and performs focus leveling control of wafer stage WST.

Main controller 20 performs preprocessing for a linkage process for every control clock (CSCK) generation, simultaneously with the focus leveling control using the measurement results of surface position measurement system 180 described above. In other words, main controller 20 obtains a difference between position coordinate ($Z_0$, θy) and position coordinate ($Z_0'$, θy') as shown in FIG. 14, and furthermore obtains a moving average MAK $\{(Z, θy)-(Z', θy')\}$ of the difference for a predetermined clock number, which is held as a coordinate offset O. However, in FIG. 14, the computing of the moving average of the difference is expressed using reference code MA.

Main controller 20 switches the focus leveling control from using surface position measurement system 180 to using interferometer system 118 in the second control clock generation during settling time $T_b$ (refer to FIG. 11B), which is after completing the acceleration of wafer stage WST in the exposure by the step-and-repeat method previously described until the beginning of exposure. On the switching, main controller 20 performs a linkage process. More specifically, main controller 20 adds the coordinate offset O kept in the first control clock generation just before to the position coordinate (Z', θy') of wafer stage WST computed from the measurement results of interferometer system 118 at the time of the second control clock generation, so that the position coordinate coincides with the position coordinate (Z, θy) of wafer stage WST computed from the measurement values of surface position measurement system 180 at the time of control clock generation (in this case, at the time of the first control clock generation) just before.

In this case, when performing an offset correction on position coordinate (Z', θy') of wafer stage WST, the value of coordinate offset O should be confirmed to be sufficiently stable for the most recent predetermined clock number. Furthermore, as is previously described, the position coordinate (Z, θy) of wafer stage WST computed from the measurement values of surface position measurement system 180 fluctuates slightly with respect to the true position by measurement errors which occur due to the production error of the scale and the like. Therefore, the offset correction should be performed at a timing (at the time of clock generation) where the difference between position coordinate (Z, θy) of wafer stage WST computed from the measurement values of surface position measurement system 180 and position coordinate (Z', θy') of wafer stage WST computed from the measurement values of interferometer system 118 coincides or almost coincides with coordinate offset O which is sufficiently stable.

During exposure time $T_c$, main controller 20 outputs position coordinate {(Z', θy')+O} on which offset correction has been performed to stage drive system 124, and performs focus leveling control of wafer stage WST.

When exposure time $T_c$ has passed and after scanning exposure to shot area $S_k$ is completed, main controller 20 switches the focus leveling control from using interferometer system 118 to using surface position measurement system 180, in the fourth control clock generation during uniform velocity overscan time (postsettling time) $T_d$. At this point, main controller 20 performs a reverse linkage process. In other words, main controller 20 substitutes position coordinate [(Z', θy')+O] to which offset cancellation has been applied into formulas (9) and (10) and computes the measurement values that each of the Z heads ZsL and ZsR are to show, and performs initialization. In FIG. 14, this reverse linkage process is shown by reference code CH.

From the next fifth control clock generation onward, main controller 20 performs the focus leveling control by surface position measurement system 180, similar to the time of the first clock generation. At the same time, main controller 20 begins to update coordinate offset O again.

Incidentally, the linkage process between encoder system 150 and interferometer system 118 in, the drive (position control) of wafer stage WST by the hybrid method using encoder system 150 and interferometer system 118, and the linkage process between surface position measurement system 180 and interferometer system 118 in the drive (focus leveling control) of wafer stage WST by the hybrid method using surface position measurement system 180 and interferometer system 118 are not limited to the ones described above, and other methods can be employed.

In exposure apparatus 100 of the embodiment, a series of operations as in (a) to (e) below using wafer stage WST and measurement stage MST is performed by main controller 20, according to a procedure similar to the one disclosed in the embodiment of, for example, U.S. Patent Application Publication No. 2008/0088843 previously described.

(a) When wafer stage WST is at an unloading position shown in FIG. 4, wafer W which has been exposed is unloaded from wafer table WTB, and when wafer stage WST has moved to a loading position LP shown in FIG. 4, a new wafer W is loaded on wafer table WTB. In the vicinity of unloading position up and loading position LP, the position of wafer stage WST in six degree of freedom is controlled, based on the measurement values of interferometer system 118. At this point, X interferometer 128 is used.

In parallel with the wafer exchange described above being performed, a baseline measurement of the secondary alignment systems $AL2_1$ to $AL2_4$ is performed. This baseline measurement is performed using alignment systems AL1 and $AL2_1$ to $AL2_4$ and simultaneously measuring reference marks M can FD bar 46 within each of the fields in a state where the θz rotation of FD bar 46 (measurement stage MST) is adjusted, based on the measurement values of encoders $70E_2$ and $70F_2$ previously described, as in the method disclosed in, U.S. Patent Application Publication No. 2008/0088843 described above.

(b) After wafer exchange and the baseline measurement of secondary alignment systems $AL2_1$ to $AL2_4$ has been completed, wafer stage WST is moved and a former processing of a baseline check of primary alignment system AL1 where fiducial marks FM on measurement plate 30 are detected by primary alignment system AL1 is performed. Around the time of this processing, resetting (reset) of the origin of encoder system 150, surface position measurement system 180, and interferometer system 118 is performed.

(c) Then, alignment measurement is performed in which alignment marks on a plurality of sample shot areas on wafer are detected using alignment systems AL1, and $AL2_1$ and $AL2_4$, while measuring the position of wafer stage WST in directions of six degrees of freedom using encoder system 150 and Z heads 72a to 72d, and concurrently with this, focus mapping (measurement of surface position (Z position) information, with measurement values of Z heads 72a to 72d serving as a reference) is performed using multipoint AF system (90a, 90b). In this case, after the beginning of alignment measurement, wafer stage WST and measurement stage MST form a scrum state before the focus mapping is started, and by moving wafer stage WST in the +Y direction for such alignment measurement and focus mapping, liquid immersion area 14 is delivered from above measurement stage MST to the area above wafer stage WST. Then, when measurement plate 30 has reached a position right under projection optical system PL, a latter processing of the baseline check of primary alignment system AL1 is performed in which a pair of alignment marks on reticle R is measured by a slit scan method, using aerial image measurement device 45.

(d) And then, the alignment measurement and the focus mapping are continued.

(e) Then, when the alignment measurement and focus mapping is completed, the plurality of shot areas on wafer W is exposed by the step-and-scan method based on the positional information of each shot area on the wafer obtained as a result of the alignment measurement and the latest baseline of the alignment system, and a pattern of the reticle is transferred. During the exposure operation, focus leveling control of wafer W is performed based on the information obtained by the focus mapping. Incidentally, while Z and θy of the wafer during the exposure is controlled, based on the measurement values of Z heads 74 and 76, θx is controlled based on the measurement values of Y interferometer 16.

As described above, in exposure apparatus 100 of the embodiment, positional information of wafer stage WST is obtained (measured) using interferometer system 118, only at exposure (scanning exposure) time $T_c$ when wafer stage WST is driven at a constant speed to form a pattern. Therefore, the linear measurement of the positional information is secured enough, which makes it possible to linearly drive wafer stage WST with high accuracy. Meanwhile, between acceleration time $T_a$ and deceleration time $T_e$ in which a step drive is performed, the positional information of wafer stage WST is obtained (measured) using encoder system 150 and surface position measurement system 180. Therefore, measurement reproducibility of the positional information is sufficiently secured by the mechanical stability of the scale, which makes it possible to drive wafer stage WST precisely to the starting position of the drive at a constant speed. Accordingly, it becomes possible to perform position alignment precisely each of the plurality of shot areas arranged on wafer W, and to form a pattern with good precision.

Further, in exposure apparatus 100 of the embodiment and its exposure method, because the stage drive control (position control) is switched to using interferometer system 118 at the time of scanning exposure, measurement errors caused by switching of the heads between encoder system and surface position measurement system 180, by scanning foreign materials adhered on the scale and the like, especially variation in discontinuous measurement results does not occur. Accordingly, a precise pattern transfer without any distortion, cracks and the like becomes possible.

Further, in the exposure apparatus of the embodiment and its exposure method, because the drive control (position control) of wafer stage WST is switched to using encoder system 150 and surface position measurement system 180 at the time of the step drive, position alignment of a pattern on the shot area can be performed with good reproducibility, as is described above. In this case, while distortion of the shot areas arranged occurring due to the measurement errors of encoder system 150, or in other words, grid errors may remain, the errors can easily be canceled by correcting the results of the alignment measurement due to the high measurement reproducibility of encoder system 150.

For example, an offset in the X-axis direction, the Y-axis direction, and the θz direction with respect to the position of the individual shot areas obtained by the alignment measurement can be prepared. In the case of exposing wafer W shown in FIG. 10, because the number of shot areas is 76, 228 offsets should be prepared. Incidentally, because high linear measurement is not required at the time of the step drive, it is not necessary to make a correction data for example, correction data of a 1 mm mesh region) used to correct the measurement errors of encoder system 150 for the entire movement area of wafer stage WST. Accordingly, it can be seen that the drive control (position control) of wafer stage WST by the hybrid method of the present embodiment is economical.

Further, the offset described above can be easily made by comparing the measurement results of encoder system 150 (surface position measurement system 180) and interferometer system 118 while driving wafer stage WST in the step-and-scan manner in the actual exposure processing, or by providing an exclusive sequence. Incidentally, in the case the offset changes over time, an exclusive sequence is to be performed when appropriate, and the offset is to be updated.

Incidentally, in the description above, as an example, during settling time $T_b$ before the scanning exposure to each of the shot areas, or in other words, while wafer stage WST is being driven at a constant speed, focus leveling control was switched from using surface position measurement system 180 to using interferometer system 118. Further, during post-settling time $T_d$ after the scanning exposure to each shot area, the focus leveling control was switched from using interferometer system 118 to using surface position measurement system 180. However, besides such switching, the focus leveling control can also be switched during acceleration time $T_a$ in which wafer stage WST is accelerated and deceleration overscan time $T_e$. However, for encoder system 150, surface position measurement system 180, and interferometer system 118, respectively, in the case measurement errors due to accelerating wafer stage WST occurs, the errors are to be appropriately corrected at the startup time of exposure apparatus 100, or during the idle status and the like.

Incidentally, in the embodiment above, while wafer stage WST was driven using interferometer system 118 at the time of the scanning exposure to each shot area on wafer, and the drive (focus leveling control) of wafer stage WST was performed using encoder system 150 and surface position measurement system 180 in the entire section at the time of stepping between the shot areas, for example, wafer stage WST can be driven using encoder system 150 and surface position measurement system 180 only partially at the time of stepping between the shot areas.

Further, in the embodiment above, in view of the point that interferometer system 118 is a stable sensor system suitable to measure the position of the wafer stage at the time of scanning exposure, since interferometer system 118 is superior in linear measurement (linearity of the measurement values) when compared with encoder system 150 and that the temporal change of the output signals at the time of abnormality is slow, interferometer system 118 is used to drive (position control) wafer stage WST at the time of scanning exposure. Further, in view of the point that encoder system 150 is a sensor system suitable to measure the position of the wafer stage at the time of stepping in between shot areas, since encoder system 150 is superior in measurement accuracy, especially in measurement reproducibility when compared with interferometer system 118, encoder system 150 is used to drive (position control) wafer stage WST at the time of stepping in between shot areas. However, requirements of a suitable sensor system which measures the position of the wafer stage at the time of scanning exposure, and a suitable sensor system which measures the position of the wafer stage at the time of stepping in between shot areas, are not limited to the ones described above. For example, a case will be considered when a first measurement system and a second measurement system that measure positional information of the wafer stage are used, by irradiating measurement beams on two different types of sensor systems, such as for example, on different measurement planes, and by receiving the reflected lights from the respective measurement planes. In this case, a controller measures the position of the wafer stage at the time of scanning exposure by the step and scan method using the first measurement system, and in a period besides the time of scanning exposure at least partially, the position of the wafer stage is to be measured using the second measurement system. The first measurement system in this case, should satisfy requirements such as the temporal change of the output signals being moderate at the time of abnormality generation, being superior in linearity of the measurement values, as well as being superior in long-term stability of the measurement values when compared with the second measurement system. Further, the second instrumentation system should satisfy requirements of being superior in measurement accuracy, being superior in measurement reproducibility, as well as having a small short-term variation of measurement values when compared with the first measurement system. Because the short-teem variation of measurement values will be large by being affected by the air fluctuation when the optical path length from the sensor to the measurement plane is long, it is naturally required for the second measurement system to have a shorter optical path length of the measurement beam to the measurement plane when compared with the first measurement system.

When considering each of the requirements described so far, for example, in the case of using the interferometer system and the encoder system, it is obvious that the interferometer system should be used as the first measurement system and the encoder system should be used as the second measurement system.

Incidentally, it is a matter of course that the configuration of each measurement device such as the encoder system described in the embodiment above is a mere example. For example, in the embodiment above, an example has been described where an encoder system is employed that has a configuration where a grid section (a Y scale and an X scale) is arranged on a wafer table (a wafer stage), and an X head and a Y head facing the grid section is placed external to the wafer stage, however, the present invention is not limited to this, and as is disclosed in, for example, the U.S. Patent Application Publication No. 2006/0227309 description, an encoder system which is configured having an encoder head arranged on the wafer stage and has a grid section (for example, a two-dimensional grid, or a linear grid section having a two-dimensional placement) facing the encoder heads placed external to the wafer stage can also be adopted. In this case, a Z head can also be arranged on the wafer stage, and the surface of the grid section can be a reflection surface on which the measurement beam of the Z head is irradiated. Further, in the case of placing a scale having a two-dimensional grating on the wafer stage, for example, the two-dimensional grating can be placed at both ends in the X-axis direction (or the Y-axis direction) on the upper surface of the wafer stage, with the Y-axis direction (or the X-axis direction) serving as the longitudinal direction. Further, the encoder head is not limited to a one-dimensional head (a 1DOF sensor), and can also be a two-dimensional head (a 2DOF sensor) whose measurement direction is in one of the X-axis direction and the Y-axis direction, and in the Z-axis direction. As such a two-dimensional head, a displacement measurement sensor head and the like whose details are disclosed in, U.S. Pat. No. 7,561,280, can be used. In the embodiment above, in the case when such two-dimensional head is employed, for example, in place of a I head, because the two-dimensional head will serve as a Y head and a Z head, Z heads 74 and 76 do not have to be provided. Further, in the case of employing a scale on which a two-dimensional diffraction grating is formed in place of the X scale and the Y scale, as the encoder head, as well as the one-dimensional head (the 1DOF sensor) and the two-dimensional head (the 2DOF sensor) whose measurement direction is in one of the X-axis direction and the Y-axis direction, and in the Z-axis direction, it becomes possible to use a two-dimensional head (a 2DOF sensor) whose measurement direction is in the periodic direction of the two-dimensional diffraction grating, such as for example, the X-axis direction and the Y-axis direction, or to use a three-dimensional head (a 3DOF sensor) whose measurement direction is in three directions which are the X-axis, the Y-axis, and the Z-axis directions.

Further, in the embodiment described above, while the case has been described where the exposure apparatus is a liquid immersion exposure apparatus which forms a liquid immersion space including the optical path of the illumination light between a projection optical system and a wafer, and exposes a wafer with an illumination light via a projection optical system and a liquid in the liquid immersion space, the exposure apparatus can also be a non-liquid immersion type apparatus.

Further, in the embodiment described above, while a case has been described where the exposure apparatus was a scanning exposure apparatus by a step-and-scan method, as well as this, the embodiment above can also be applied to a reduction projection exposure apparatus by a step-and-stitch method that synthesizes a shot area and a shot area, an exposure apparatus by a proximity method, a mirror projection aligner and the like. Further, the embodiment described above can also be applied to a multi-stage type exposure apparatus equipped with a plurality of wafer stages, as is disclosed in, for example, U.S. Pat. Nos. 6,590,634, 5,969,441, 6,208,407 and the like.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image. Further, the illumination area and exposure area described above are to have a rectangular shape. However, the shape is not limited to rectangular, and can also be circular arc, trapezoidal, parallelogram or the like.

Incidentally, a light source of the exposure apparatus in the embodiment above is not limited to the ArF excimer laser, but a pulse laser light source such as a KrF excimer laser (output wavelength: 248 nm), an $F_2$ laser (output wavelength: 157 nm), an Ar2 laser (output wavelength: 126 nm) or a Kr2 laser (output wavelength: 146 nm), or an extra-high pressure mercury lamp that generates an emission line such as a g-line (wavelength: 436 nm), an i-line (wavelength: 365 nm) and the like can also be used. Further, a harmonic wave generating unit of a YAG laser or the like can also be used. Besides the sources above, as is disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a non-linear optical crystal, can also be used.

In addition, illumination light IL of the exposure apparatus 10 in the embodiment described above is not limited to light with a wavelength of 100 nm or greater, and, of course, light with a wavelength of less than 100 nm may be used. For example, the present invention can be preferably applied to an EUV exposure apparatus which uses the EUV (Extreme Ultraviolet) light of the soft X ray region (for example, wavelength area of 5-15 nm) as an exposure light, and uses a total reflection reduction optical system and a reflection type mask. In addition, the embodiment described above can also be applied to an exposure apparatus that uses charged particle beams such as an electron beam or an ion beam.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No.

6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used.

Further, for example, the embodiment described above can also be applied to an exposure apparatus (lithography system) that forms line-and-space patterns on a wafer by forming interference fringes on the wafer.

Moreover, as disclosed in, for example, U.S. Pat. No. 6,611,316, the embodiment above can also be applied to an exposure apparatus that synthesizes two reticle patterns via a projection optical system and almost simultaneously performs double exposure of one shot area by one scanning exposure.

Further, an apparatus that forms a pattern on an object is not limited to the exposure apparatus (lithography system) described above, and for example, the embodiment described above can also be applied to an apparatus that forms a pattern on an object by an ink-jet method.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for transferring a liquid crystal display device pattern onto a rectangular glass plate, and an exposure apparatus for producing organic ELs, thin-film magnetic heads, imaging devices (such as CODS) micromachines, DNA chips, and the like. Further, the embodiment described above can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Incidentally, the disclosures of all publications, the PCT International Publications, the U.S. patent applications and the U.S. patents that are cited in the description so far related to exposure apparatuses and the like are each incorporated herein by reference.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a reticle is transferred onto the wafer by the exposure apparatus (pattern formation apparatus) in the embodiment previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus of the embodiment, a highly integrated device can be produced with good productivity.

Further, the exposure apparatus (pattern formation apparatus) of the embodiment above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure method in which a pattern is sequentially formed on a plurality of shot areas arranged on an object, the method comprising:

measuring a positional information of a movable body which moves along a predetermined plane holding the object by a first measurement system which irradiates a first measurement beam on a first measurement plane and receives a reflected beam, and performing a constant speed drive of the movable body in a scanning direction to form the pattern in each of the plurality of shot areas using the measurement results of the first measurement system;

measuring a positional information of the movable body by a second measurement system which irradiates a second measurement beam on a second measurement plane different from the first measurement plane, and receives a reflected beam, and performing a stepping drive of the movable body toward a starting position of the constant speed drive to form the pattern in each of the plurality of shot areas using the measurement results of the second measurement system; and switching a measurement system which obtains the positional information used to drive the movable body from one of the first measurement system and the second measurement system to the other of the first measurement system and the second measurement system, in accordance with whether the constant speed drive or the stepping drive is being performed.

2. The exposure method according to claim 1, the method further comprising:
switching the measurement system which obtains the positional information used to drive the movable body from the second measurement system to the first measurement system, before the constant speed drive is performed.

3. The exposure method according to claim 2, the method further comprising:
making an offset used to reset measurement results of the first measurement system using measurement results of the first and second measurement systems, and resetting the measurement results of the first measurement system using the offset, prior to switching the measurement system.

4. The exposure method according to claim 3 wherein the offset is made by time averaging a difference between the measurement results of the first and second measurement systems.

5. The exposure apparatus according to claim 3 wherein the offset is made by collecting the measurement results of the first and second measurement systems for each predetermined time, and applying moving averaging to the difference of the measurement results which have been collected.

6. The exposure method according to claim 4 wherein the measurement results of the first measurement system are reset using the offset, after the offset is converged.

7. The exposure method according to claim 6 wherein the measurement results of the first measurement system are reset when a difference of the measurement results of the first and second measurement systems coincides with the offset which has been converged.

8. The exposure method according to claim 3 wherein the measurement results of the first measurement system are reset so that the measurement results coincide with the measurement results of the second measurement system.

9. The exposure method according to claim 3 wherein the measurement results of the first measurement system are reset while the movable body is being moved at a constant speed.

10. The exposure method according to claim 3, the method further comprising:
correcting measurement errors of the first measurement system which are caused due to acceleration of the movable body, wherein
the measurement results of the first measurement system are reset while the movable body is accelerated.

11. The exposure method according to claim 1 wherein an optical path length of the second measurement beam reaching the second measurement plane is set shorter than an optical path length of the first measurement beam reaching the first measurement plane.

12. The exposure method according to claim 1 wherein the first measurement plane is a reflection surface provided on the movable body, and
the first measurement system includes an interferometer system which obtains positional information of the movable body by irradiating the first measurement beam on the reflection surface and receiving a reflected beam from the reflection surface.

13. The exposure method according to claim 1 wherein the second measurement plane is a measurement plane which is parallel to the predetermined plane provided on at least one of the movable body and an outside of the movable body, and has a diffraction grating on a surface, and
the second measurement system includes an encoder system which obtains positional information in a predetermined measurement direction of the movable body by irradiating the second measurement beam on the second measurement plane from the other of the movable body and an outside of the movable body, and receiving a diffraction beam from the diffraction grating.

14. The exposure method according to claim 13 wherein the encoder system obtains positional information of the movable body in at least one direction of a direction parallel to the predetermined plane, a perpendicular direction with respect to the predetermined plane, and a tilt direction with respect to the predetermined plane.

15. The exposure method according to claim 1 wherein the first measurement system is superior in linearity of measurement values to the second measurement system.

16. The exposure method according to claim 1 wherein the first measurement system is superior in long-term stability of measurement values to the second measurement system.

17. The exposure method according to claim 1 wherein the first measurement system is slower in temporal change of output signals at the time of abnormality generation than the second measurement system.

18. The exposure method according to claim 1 wherein the second measurement system is smaller in short-term variation of measurement values than the first measurement system.

19. The exposure method according to claim 1 wherein the second measurement system is superior in measurement accuracy to the first measurement system.

20. The exposure method according to claim 1 wherein the second measurement system is superior in measurement reproducibility to the first measurement system.

21. The exposure method according to claim 1, the method further comprising:
switching the measurement system which obtains the positional information used to drive the movable body from the first measurement system to the second measurement system, after the constant speed drive is performed.

22. The exposure method according to claim 1 wherein the pattern is formed on the object by projecting an energy beam via a mask on which the pattern is formed and an optical system, and
in the formation, position alignment of the pattern to each of the plurality of shot areas is performed by driving an optical element which configures the optical system.

23. The exposure method according to claim 1 wherein the pattern is formed on the object by performing a relative drive of a mask on which the pattern is formed and the object, and
in the formation, position alignment of the pattern to each of the plurality of shot areas is performed by adjusting the relative drive.

24. A device manufacturing method, including
forming a pattern on an object by the exposure method according to claim 1; and
developing the object on which the pattern is formed.

25. An exposure apparatus which sequentially forms a pattern on a plurality of shot areas arranged on an object, the apparatus comprising:
a movable body which holds the object and moves along a predetermined plane;

a first measurement system which measures positional information of the movable body by irradiating a first measurement beam on a first measurement plane and receiving a reflected beam;

a second measurement system which measures positional information of the movable body by irradiating a second measurement beam on a second measurement plane different from the first measurement plane and receiving a reflected beam; and a control system which performs a constant speed drive of the movable body in a scanning direction to form the pattern in each of the plurality of shot areas using measurement results of the first measurement system, and performs a step drive of the movable body toward a starting position of the constant speed drive to form the pattern in each of the plurality of shot areas using measurement results of the second measurement system, wherein the control system switches a measurement system that obtains the positional information used to drive the movable body from one of the first measurement system and the second measurement system to the other of the first measurement system and the second measurement system, in accordance with whether the control system performs the constant speed drive or the stepping drive.

26. The exposure apparatus according to claim 25 wherein the control system switches the measurement system which obtains the positional information used to drive the movable body from the second measurement system to the first measurement system, before the constant speed drive is performed.

27. The exposure apparatus according to claim 26 wherein the control system makes an offset used to reset measurement results of the first measurement system using measurement results of the first and second measurement systems, and resets the measurement results of the first measurement system using the offset, prior to switching the measurement system.

28. The exposure apparatus according to claim 26 wherein the control system switches the measurement system which obtains the positional information used to drive the movable body from the first measurement system to the second measurement system, after the constant speed drive is performed.

29. The exposure apparatus according to claim 25 wherein an optical path length of the second measurement beam reaching the second measurement plane is set shorter than an optical path length of the first measurement beam reaching the first measurement plane.

30. The exposure apparatus according to claim 25 wherein the first measurement plane is a reflection surface provided on the movable body, and the first measurement system includes an interferometer system which obtains positional information of the movable body by irradiating the first measurement beam on the reflection surface and receiving a return beam from the reflection surface.

31. The exposure apparatus according to claim 25 wherein the second measurement plane is a measurement plane which is parallel to the predetermined plane provided on at least one of the movable body and an outside of the movable body, and has a diffraction grating on a surface, and the second measurement system includes an encoder system which obtains positional information in a predetermined measurement direction of the movable body by irradiating the second measurement beam on the second measurement plane from the other of the movable body and an outside of the movable body, and receiving a diffraction beam from the diffraction grating.

32. The exposure apparatus according to claim 31 wherein the encoder system obtains positional information of the movable body in at least one direction of a direction parallel to the predetermined plane, a perpendicular direction with respect to the predetermined plane, and a tilt direction with respect to the predetermined plane.

33. The exposure apparatus according to claim 25 wherein the first measurement system is superior in linearity of measurement values to the second measurement system.

34. The exposure apparatus according to claim 25 wherein the first measurement system is superior in long-term stability of measurement values to the second measurement system.

35. The exposure apparatus according to claim 25 wherein the first measurement system is slower in temporal change of output signals at the time of abnormality generation than the second measurement system.

36. The exposure apparatus according to claim 25 wherein the second measurement system is smaller in short-term variation of measurement values than the first measurement system.

37. The exposure apparatus according to claim 25 wherein the second measurement system is superior in measurement accuracy to the first measurement system.

38. The exposure apparatus according to claim 25 wherein the second measurement system is superior in measurement reproducibility to the first measurement system.

39. The exposure apparatus according to claim 25, the apparatus further comprising:

an optical system which projects an image of the pattern on the object, wherein the control system performs position alignment of the pattern to each of the plurality of shot areas by driving an optical element which configures the optical system.

40. The exposure apparatus according to claim 25, the apparatus further comprising:

another movable body which moves holding a mask on which the pattern is formed, wherein the control system performs position alignment of the pattern to each of the plurality of shot areas by adjusting a relative drive of the another movable body and the movable body.

41. A device manufacturing method, including forming a pattern on an object using the exposure apparatus according to claim 25; and developing the object on which the pattern is formed.

42. A making method of an exposure apparatus which sequentially forms a pattern on a plurality of shot areas arranged on an object, the method comprising:

providing a movable body which holds the object and moves along a predetermined plane;

providing a first measurement system which measures positional information of the movable body by irradiating a first measurement beam on a first measurement plane and receiving a reflected beam;

providing a second measurement system which measures positional information of the movable body by irradiating a second measurement beam on a second measurement plane different from the first measurement plane and receiving a reflected beam; and providing a control system which performs a constant speed drive of the movable body in a scanning direction to form the pattern in each of the plurality of shot areas using measurement results of the first measurement system, and performs a step drive of the movable body toward a starting position of the constant speed drive to form the pattern in each of the plurality of shot areas using measurement results of the second measurement system, wherein the control system switches a measurement system that obtains the positional information used to drive the movable body from one of the first measurement system and the second measurement system to the other of the first measurement system and the second measurement system, in accordance with whether the control system performs the constant speed drive or the step drive.

* * * * *